US012567368B2

(12) United States Patent
Zhou et al.

(10) Patent No.: US 12,567,368 B2
(45) Date of Patent: Mar. 3, 2026

(54) DISPLAY DEVICE HAVING A MULTIPLEXING CURCUIT DRIVEN BY SELECTION SIGNAL GROUPS AND DRIVING METHOD THEREOF

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Zhenli Zhou, Beijing (CN); Fengli Ji, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/834,236

(22) PCT Filed: Oct. 7, 2023

(86) PCT No.: PCT/CN2023/123236
§ 371 (c)(1),
(2) Date: Jul. 30, 2024

(87) PCT Pub. No.: WO2024/088027
PCT Pub. Date: May 2, 2024

(65) Prior Publication Data
US 2025/0118255 A1     Apr. 10, 2025

(30) Foreign Application Priority Data
Oct. 27, 2022    (CN) ......................... 202211329365.X

(51) Int. Cl.
*G09G 3/3233*     (2016.01)
*H10K 59/131*     (2023.01)
*G09G 3/00*       (2006.01)

(52) U.S. Cl.
CPC ......... *G09G 3/3233* (2013.01); *H10K 59/131* (2023.02); *G09G 3/035* (2020.08);
(Continued)

(58) Field of Classification Search
CPC .................................................. G09G 3/3233
(Continued)

(56) References Cited

U.S. PATENT DOCUMENTS

| 2007/0091050 | A1* | 4/2007 | Katayama | ............ | G09G 3/3688 |
| | | | | | 345/98 |
| 2019/0259324 | A1* | 8/2019 | Liu | ....................... | G09G 3/2003 |
| 2020/0184895 | A1* | 6/2020 | Zhao | .................... | G09G 3/2074 |

FOREIGN PATENT DOCUMENTS

| CN | 108335675 A | 7/2018 |
| CN | 109637414 A | 4/2019 |

(Continued)

OTHER PUBLICATIONS

International Search Report for PCT/CN2023/123236 Mailed Dec. 28, 2023.

*Primary Examiner* — Long D Pham
(74) *Attorney, Agent, or Firm* — Ling Wu; Stephen Yang; Ling and Yang Intellectual Property

(57) ABSTRACT

Disclosed is a display substrate, including: multiple sub-pixels arranged in an array, multiple multiplexing circuits, multiple data signal lines, multiple selection signal lines and multiple data transmission lines, wherein the multiple sub-pixels include multiple color sub-pixels, and the data signal lines are electrically connected to the multiple sub-pixels; the multiple multiplexing circuits include multiple multi-
(Continued)

plexing transistors, which are respectively electrically connected to the data transmission lines, the selection signal lines and the data signal lines; the multiple selection signal lines are divided into multiple selection signal groups, and at least one selection signal group include multiple selection signal lines; the selection signal lines included in different selection signal groups are different, and the selection signal groups are electrically connected to the sub-pixels by means of the multiplexing transistors and the data signal lines; the colors of the sub-pixels electrically connected to the same selection signal group are the same.

16 Claims, 11 Drawing Sheets

(52) U.S. Cl.
CPC .............. *G09G 2300/0452* (2013.01); *G09G 2300/0819* (2013.01); *G09G 2300/0842* (2013.01); *G09G 2300/0861* (2013.01); *G09G 2310/0297* (2013.01); *G09G 2310/08* (2013.01)

(58) Field of Classification Search
USPC ......................................................... 345/694
See application file for complete search history.

(56) References Cited

FOREIGN PATENT DOCUMENTS

| CN | 110930938 A | 3/2020 |
|----|-------------|--------|
| CN | 110955091 A | 4/2020 |
| CN | 112687237 A | 4/2021 |
| CN | 114120925 A | 3/2022 |
| CN | 115662331 A | 1/2023 |
| KR | 1020090070324 A | 7/2009 |

\* cited by examiner

DISPLAY DEVICE HAVING A MULTIPLEXING CURCUIT DRIVEN BY SELECTION SIGNAL GROUPS AND DRIVING METHOD THEREOF

CROSS-REFERENCE TO RELATED APPLICATIONS

The present application is a U.S. National Phase Entry of International Application No. PCT/CN2023/123236 having an international filing date of Oct. 7, 2023, which claims priority to Chinese Patent Application No. 202211329365.X, filed to the CNIPA on Oct. 27, 2022, contents of the above-identified applications should be construed as being incorporated herein by reference.

TECHNICAL FIELD

The present disclosure relates to, but is not limited to, the field of display technologies, and more particularly, to a display substrate and a driving method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT for short) has become a mainstream product in the field of display at present.

SUMMARY

The following is a summary of subject matters described in detail in the present disclosure. The summary is not intended to limit the protection scope of claims.

In a first aspect, the present disclosure provides a display substrate, including: a plurality of sub-pixels arranged in an array, a multiplexing circuit, a plurality of data signal lines, a plurality of selection signal lines, and a plurality of data transmission lines, wherein the plurality of sub-pixels include: a plurality of color sub-pixels, the data signal lines are electrically connected with the plurality of sub-pixels; the multiplexing circuit includes: a plurality of multiplexing transistors, at least one of the plurality of multiplexing transistors is electrically connected with at least one of the plurality of data transmission lines, at least one of the plurality of selection signal lines, and at least one of the plurality of data signal lines, respectively, and the multiplexing transistor is configured to transmit a signal of the data transmission line to the data signal line under control of the selection signal line; the plurality of selection signal lines are divided into a plurality of selection signal groups, at least one selection signal group includes: a plurality of selection signal lines, different selection signal groups include different selection signal lines, and at least one of the plurality of selection signal groups is electrically connected with sub-pixels through the multiplexing transistor and the data signal line; colors of sub-pixels electrically connected with a same selection signal group are the same, and colors of sub-pixels electrically connected with different selection signal groups are different, effective time periods of any two selection signal groups among the plurality of selection signal groups are not overlapped, wherein an effective time period of the selection signal group refers to a time period between a start time when a signal is an effective level signal at the earliest and an end time when a signal is an effective level signal at the latest in selection signal lines of the selection signal group.

In an exemplary implementation mode, the sub-pixels include a first color sub-pixel, a second color sub-pixel, and a third color sub-pixel, a first color, a second color, and a third color are different colors and are one of red, blue, and green, respectively; an i-th data signal line is electrically connected with an i-th column of sub-pixels; a $(3{\times}i{-}2)$-th column of sub-pixels are first color sub-pixels, a $(3{\times}i{-}1)$-th column of sub-pixels are second color sub-pixels, a $(3{\times}i)$-th column of sub-pixels are third color sub-pixels, wherein $1{\le}i{\le}N/3$, ${\times}$ is a multiplication operation, $/$ is a quotient operation, N is a quantity of data signal lines, and N is a positive integer greater than or equal to 6.

In an exemplary implementation mode, the plurality of selection signal groups include: a first selection signal group, a second selection signal group, and a third selection signal group; a sub-pixel electrically connected with the first selection signal group is a first color sub-pixel, a sub-pixel electrically connected with the second selection signal group is a second color sub-pixel, and a sub-pixel electrically connected with the third selection signal group is a third color sub-pixel.

In an exemplary implementation mode, an effective time period of a selection signal group electrically connected with a blue sub-pixel is earlier than effective time periods of a selection signal group electrically connected with a red sub-pixel and a selection signal group electrically connected with a green sub-pixel.

In an exemplary implementation mode, the multiplexing circuit includes N/M multiplexing sub-circuits; a j-th multiplexing sub-circuit is electrically connected with M data signal lines, a j-th data transmission line, and M selection signal lines respectively, M is a quantity of selection signal lines, $j{=}1, 2, \ldots, N/M, M{=}3{\times}S$, M is a positive integer greater than or equal to 6, and S is a positive integer greater than or equal to 2.

In an exemplary implementation mode, a quantity of multiplexing transistors is N, and N multiplexing transistors are all N-type transistors or P-type transistors; a control electrode of an n-th multiplexing transistor is electrically connected with an l-th selection signal line, a first electrode of the n-th multiplexing transistor is electrically connected with an n-th data signal line, and a second electrode of the n-th multiplexing transistor is electrically connected with a w-th data transmission line, and $\%$ is a remainder operation, $n{=}1, 2, \ldots, N$.

$$l = \begin{cases} M, & n \text{ is an integer multiple of } M \\ n \ \% \ M, & n \text{ is not an integer multiple of } M \end{cases}$$

$$w = \begin{cases} (n/M), & n \text{ is an integer multiple of } M \\ (n/M) + 1, & n \text{ is not an integer multiple of } M \end{cases}$$

The j-th multiplexing sub-circuit includes: an $(M{\times}(j{-}1){+}1)$-th multiplexing transistor to an $(M{\times}j)$-th multiplexing transistor.

In an exemplary implementation mode, a plurality of scan signal lines are further included, and the plurality of scan signal lines are electrically connected with the plurality of sub-pixels; when a signal of an m-th selection signal line is an effective level signal, signals of selection signal lines other than the m-th selection signal line are all ineffective level signals, m=1, 2, . . . , M; content displayed by the display substrate includes a plurality of display frames, and when a k-th row of sub-pixels of at least one display frame are displayed, an end time when a signal in a plurality of selection signal lines is an effective level signal at the latest is earlier than a start time when a signal of a scan signal line electrically connected with the k-th row of sub-pixels is an effective level signal.

In an exemplary implementation mode, in a same display frame, when all rows in the same display frame are displayed, sequences of occurrence time when signals of a plurality of selection signal lines are effective level signals are the same; in different display frames, sequences of occurrence time when signals of a plurality of selection signal lines are effective level signals are the same when a same row is displayed.

In an exemplary implementation mode, in a same display frame, for adjacent M/3 rows, sequences of occurrence time when signals of a plurality of selection signal lines are effective level signals are different when different rows are displayed, and seat orders where occurrence time when a signal of a same selection signal line is an effective level signal is located when different rows are displayed are different; in different display frames, sequences of occurrence time when signals of a plurality of selection signal lines are effective level signals are the same when a same row is displayed.

In an exemplary implementation mode, in a same display frame, when a plurality of rows whose row number x satisfies x%(M/3)=y are displayed, sequences of occurrence time when signals of a plurality of selection signal lines are effective level signals are the same, y=0, . . . , (M/3)−1.

In an exemplary implementation mode, in a same display frame, when all rows in the same display frame are displayed, sequences of occurrence time when signals of a plurality of selection signal lines are effective level signals are the same; in adjacent M/3 display frames, when different display frames are displayed, sequences of occurrence time when signals of a plurality of selection signal lines are effective level signals are different, and seat orders where occurrence time when a signal of a same selection signal line is an effective level signal is located when different display frames are displayed are different.

In an exemplary implementation mode, for all display frames, when a plurality of display frames whose frame number z satisfies z%(M/3)=y are displayed, sequences of occurrence time when signals of a plurality of selection signal lines are effective level signals are the same, y=0, . . . , (M/3)−1.

In an exemplary implementation mode, in a same display frame, for adjacent M/3 rows, sequences of occurrence time when signals of a plurality of selection signal lines are effective level signals are different when different rows are displayed, and seat orders where occurrence time when a signal of a same selection signal line is an effective level signal is located when different rows are displayed are different; in adjacent M/3 display frames, when a same row of different display frames is displayed, sequences of occurrence time when signals of a plurality of selection signal lines are effective level signals are different, and seat orders where occurrence time when a signal of a same selection signal line is an effective level signal is located when the same row of different display frames is displayed are different.

In an exemplary implementation mode, in a same display frame, when a plurality of rows whose row number x satisfies x%(M/3)=y are displayed, sequences of occurrence time when signals of a plurality of selection signal lines are effective level signals are the same; for all display frames, when a same row of a plurality of display frames whose frame number z satisfies z%(M/3)=y is displayed, sequences of occurrence time when signals of a plurality of selection signal lines are effective level signals are the same, y=0, . . . , M/3−1.

In an exemplary implementation mode, a first signal line is included, the first signal line at least includes a scan signal line, the first signal line and a data signal line are disposed in different layers, and an orthographic projection of the first signal line on a base substrate is at least partially overlapped with an orthographic projection of the data signal line on the base substrate, and a capacitance located between an overlapping region of the data signal line and the first signal line is a data parasitic capacitance of the data signal line; for at least one multiplexing sub-circuit, data parasitic capacitances of a plurality of data signal lines electrically connected with sub-pixels of a same color are different.

In an exemplary implementation mode, for at least one multiplexing sub-circuit, among a plurality of data signal lines electrically connected with sub-pixels of a same color, a data parasitic capacitance of an a-th data signal line is greater than a data parasitic capacitance of a in b-th data signal line when a time when a signal of a selection signal line electrically connected with a multiplexing transistor connected with the a-th data signal line is an effective level signal is earlier than a time when a signal of a selection signal line connected with a multiplexing transistor connected with the b-th data signal line is an effective level signal.

In an exemplary implementation mode, for at least one multiplexing sub-circuit, data parasitic capacitances of at least two data signal lines electrically connected with different color sub-pixels are equal.

In an exemplary implementation mode, data parasitic capacitances of a (3i−2)-th data signal line to a 3i-th data signal line are equal.

In a second aspect, the present disclosure also provides a display apparatus, including the display substrate described above.

In a third aspect, the present disclosure also provides a drive method of a display substrate, for driving the display substrate described above, and the method includes: providing a signal to a plurality of selection signal lines to enable effective time periods of any two of a plurality of selection signal groups to be not overlapped.

Other aspects may be comprehended after accompany drawings and detailed description are read and understood.

BRIEF DESCRIPTION OF DRAWINGS

The accompany drawings are used to provide understanding of technical solutions of the present disclosure, and form a part of the specification. The accompany drawings and embodiments of the present disclosure are adopted to explain the technical solutions of the present disclosure, and do not form limitations on the technical solutions of the present disclosure.

DETAILED DESCRIPTION

Figure 1:
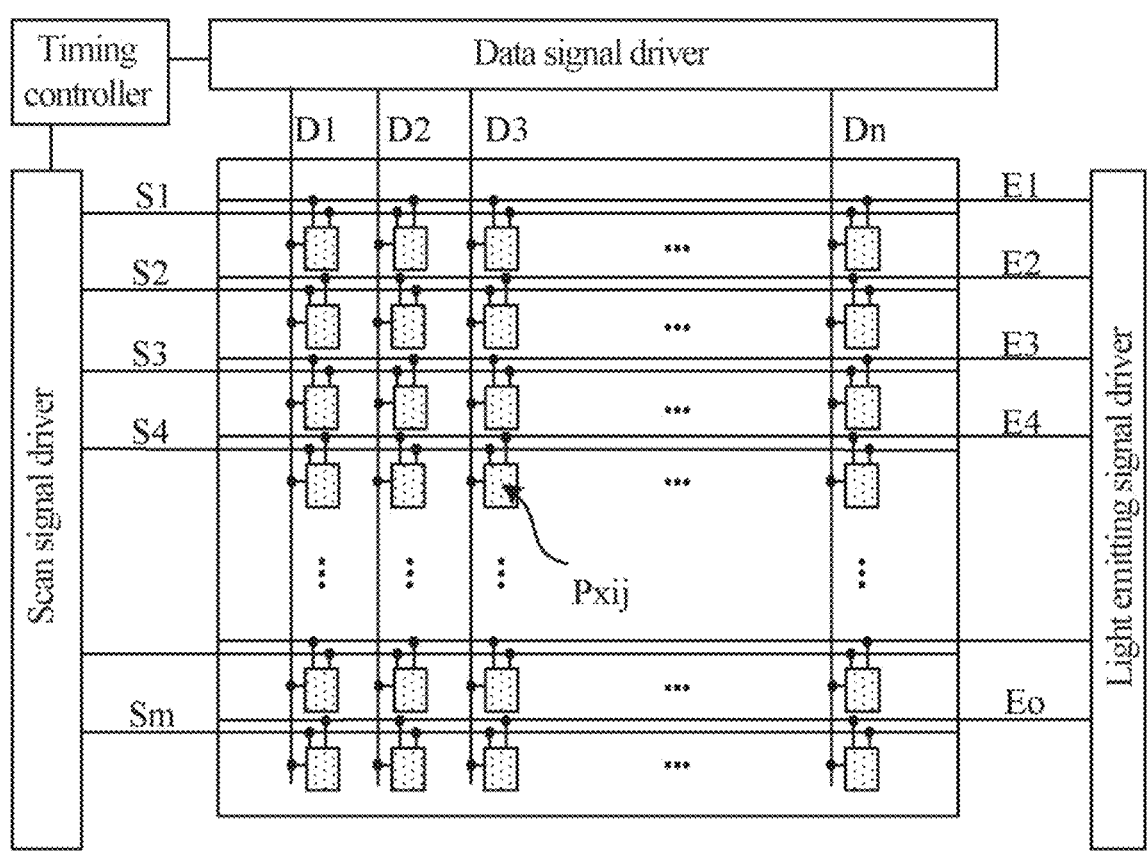
FIG. 1 is a schematic diagram of a structure of a display apparatus.

To make objectives, the technical solutions, and advantages of the present disclosure clearer, the embodiments of the present disclosure will be described in detail below with reference to the accompany drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents recorded in following implementation modes only. The embodiments and features in the embodiments of the present disclosure may be randomly combined with each other if there is no conflict. In order to keep following description of the embodiments of the present disclosure clear and concise, detailed description of part of known functions and known components are omitted in the present disclosure. The drawings of the embodiments of the present disclosure only involve structures involved in the embodiments of the present disclosure, and for other structures, reference may be made to conventional designs.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals "first", "second", "third", etc., in the specification are set not to form limits in numbers but only to avoid confusion between constituent elements.

In the specification, for convenience, expressions "central", "above", "below", "front", "back", "vertical", "horizontal", "top", "bottom", "inside", "outside", etc., indicating directional or positional relationships are used to illustrate positional relationships between the constituent elements with reference to the drawings, not to indicate or imply that a referred apparatus or element must have a specific orientation and be structured and operated with the specific orientation, but only to easily describe the specification and simply the description, and thus should not be understood as limitations on the present disclosure. The positional relationships between the constituent elements may be changed as appropriate according to a direction according to which each constituent element is described. Therefore, appropriate replacements based on situations are allowed, which is not limited to the expressions in the specification.

In the specification, unless otherwise specified and defined, terms "mounting", "mutual connection", and "connection" should be understood in a broad sense. For example, a connection may be a fixed connection, or a detachable connection, or an integral connection; it may be a mechanical connection or an electrical connection; it may be a direct connection, or an indirect connection through middleware, or internal communication inside two elements. Those of ordinary skills in the art may understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In a case that transistors with opposite polarities are used, or in a case that a direction of a current changes during operation of a circuit, or the like, functions of the "source electrode" and the "drain electrode" are sometimes interchangeable. Therefore, the "source electrode" and the "drain electrode" are interchangeable in the specification.

In the specification, an "electrical connection" includes a case that constituent elements are connected together through an element with a certain electrical action. The "element with a certain electrical action" is not particularly limited as long as electrical signals between the connected constituent elements may be sent and received. Examples of the "element with a certain electrical action" not only include an electrode and a wiring, but also include a switching element such as a transistor, a resistor, an inductor, a capacitor, and another element with various functions, etc.

In the specification, "parallel" refers to a state in which an angle formed by two straight lines is −10° or more and 10° or less, and thus also includes a state in which the angle is −5° or more and 5° or less. In addition, "perpendicular"

refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

In the specification, "disposed in a same layer" refers to a structure formed by patterning two (or more than two) structures through a same patterning process, and their materials may be the same or different. For example, materials of precursors for forming multiple structures disposed in a same layer are the same, and materials finally formed may be the same or different.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be chamfers, arc edges, and deformations, etc.

In the present disclosure, "about" refers to that a boundary is not defined so strictly and numerical values within a range of process and measurement errors are allowed.

A data drive chip in a display apparatus supplies a data signal to a sub-pixel in a display through a data signal line. Due to a large quantity of data signal lines in the display apparatus, the data drive chip needs more pins, so that there are correspondingly more data transmission lines for transmitting data signals to the data signal lines, which is not conducive to achieving a narrow bezel of the display. In order to achieve a full screen, by reducing a quantity of data transmission lines, in the display substrate, a multiplexing circuit MUX is provided between the data transmission lines and the data signal lines, and the multiplexing circuit MUX is electrically connected with a plurality of selection signal lines and the data transmission lines. At present, a commonly used solution is that the data drive chip may connect multiple columns of sub-pixels with one data transmission line by setting the multiplexing circuit MUX, which may greatly reduce a quantity of data transmission lines, reduce a size of the data drive chip, and reduce a size of a bezel of the display.

In order to ensure that data signals may be supplied to all sub-pixels, the multiplexing circuit MUX is electrically connected with a plurality of selection signal lines, and a signal of a data transmission line is supplied to a data signal line under control of a selection signal line. In order to display normally, a plurality of selection signals of a plurality of selection signal lines must be turned on in turn. Therefore, when each row of sub-pixels is displayed, data voltages of a plurality of data signal lines are stored in parasitic capacitors on the data signal lines for inconsistent times. In this process, there will inevitably be a leakage. A data voltage written first attenuates the most severely, and attenuation of a data voltage written last is relatively low. In this way, a brightness difference caused by a data voltage difference is generated, which may form vertical bright and dark stripes, reducing a display effect of the display substrate.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with a plurality of data signal lines (D1 to Dn)

respectively, the scan driver is connected with a plurality of scan signal lines (S1 to Sm) respectively, and the light emitting driver is connected with a plurality of light emitting signal lines (E1 to Eo) respectively. The pixel array may include multiple sub-pixels Pxij, wherein i and j may be natural numbers. At least one sub-pixel Pxij may include a circuit unit and a light emitting device connected with the circuit unit. The circuit unit may include a pixel drive circuit, and the pixel drive circuit may be connected with a scan signal line, a light emitting signal line, and a data signal line respectively. In an exemplary implementation mode, the timing controller may provide a grayscale value and a control signal which are suitable for a specification of the data driver to the data driver, may provide a clock signal and a scan start signal and the like which are suitable for a specification of the scan driver to the scan driver, and may provide a clock signal and an emission stop signal and the like which are suitable for a specification of the light emitting driver to the light emitting driver. The data driver may generate data voltages to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a pixel row as a unit, wherein n may be a natural number. The scan driver may generate scan signals to be provided to the scan signal lines S1, S2, S3, . . . , and Sm by receiving the clock signal and the scan start signal and the like from the timing controller. For example, the scan driver may sequentially provide a scan signal with an on-level pulse to the scan signal lines S1 to Sm. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number. The light emitting driver may generate an emission signal to be provided to the light emitting signal lines E1, E2, E3, . . . , and Eo by receiving the clock signal, the emission stop signal, etc., from the timing controller. For example, the light emitting driver may sequentially provide an emission signal with an off-level pulse to the light emitting signal lines E1 to Eo. For example, the light emitting driver may be constructed in a form of a shift register and generate an emission signal in a manner of sequentially transmitting an emission stop signal provided in a form of an off-level pulse to a next-stage circuit under control of the clock signal, wherein o may be a natural number.

Figure 2:
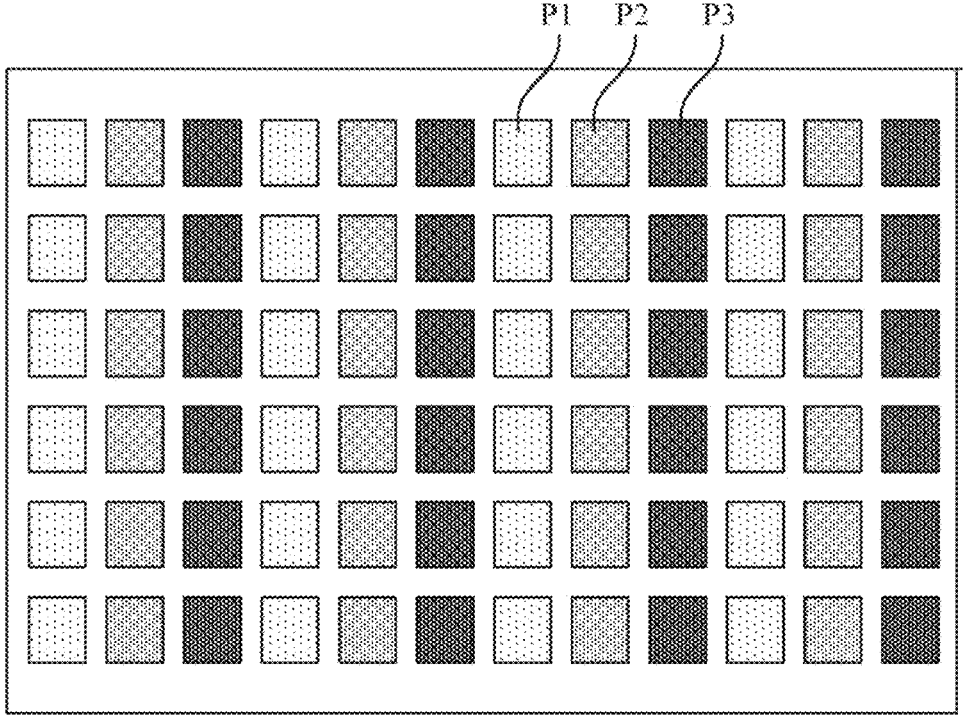
FIG. 2 is a schematic diagram of a planar structure of a display substrate.

FIG. 2 is a schematic diagram of a planar structure of a display substrate. As shown in FIG. 2, the display substrate may include a plurality of pixel units arranged in a matrix, at least one of the plurality of pixel units includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light emitting device. Pixel drive circuits in the first sub-pixel P1, the second sub-pixel P2, and the third sub-pixel P3 are connected with a scan signal line, a data signal line, and a light emitting signal line respectively. A pixel drive circuit is configured to receive a data voltage transmitted by the data signal line under control of the scan signal line and the light emitting signal line, and output a corresponding current to the light emitting device. Light emitting devices in the first sub-pixel P1, the second sub-pixel P2, and the third sub-pixel P3 are respectively connected with a pixel drive circuit of a sub-pixel in which a light emitting device is located, and the light emitting device is configured to emit light with corresponding brightness in response to a current outputted by the pixel drive circuit of the sub-pixel in which the light emitting device is located.

In an exemplary implementation mode, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation mode, a sub-pixel may have a shape of a rectangle, a rhombus, a pentagon, or a hexagon.

Figures 3, 4:
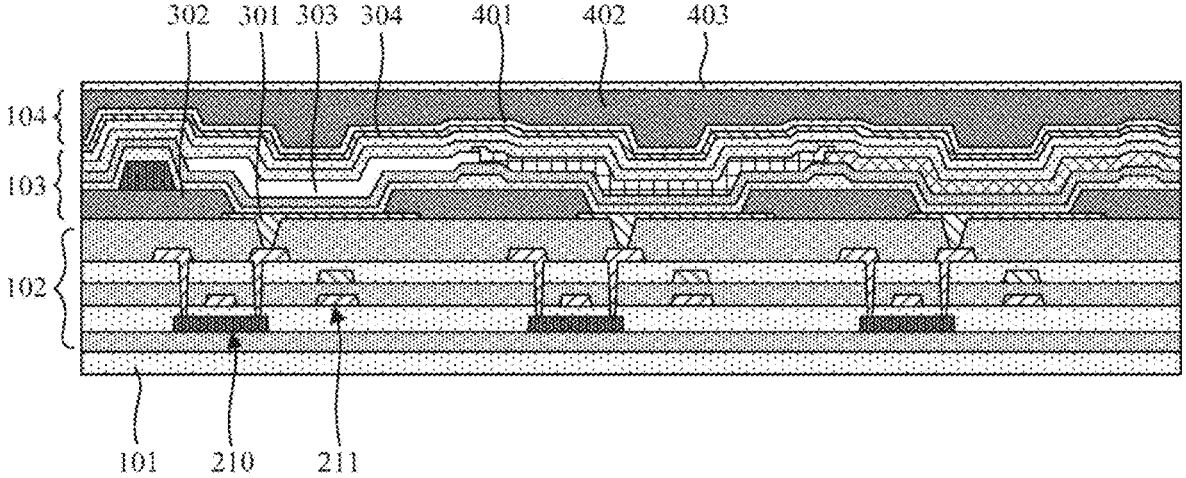
FIG. 3 is a schematic diagram of a sectional structure of a display substrate.
FIG. 4 is an equivalent circuit diagram of a pixel drive circuit.

FIG. 3 is a schematic diagram of a sectional structure of a display substrate, which illustrates a structure of three sub-pixels of an OLED display substrate. As shown in FIG. 3, on a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101. In some possible implementation modes, the display substrate may include another film layer, such as a touch structure layer, which is not limited here in the present disclosure.

In an exemplary implementation mode, the base substrate 101 may be a flexible base substrate, or may be a rigid base substrate. The drive circuit layer 102 of each sub-pixel may include a plurality of transistors and a storage capacitor that form a pixel drive circuit. FIG. 3 is illustrated by only taking one transistor 101 and one storage capacitor 101A as an example. The light emitting structure layer 103 may include an anode 301, a pixel definition layer 302, an organic emitting layer 303, and a cathode 304. The anode 301 is connected with a drain electrode of a drive transistor 210 through a via, the organic emitting layer 303 is connected with the anode 301, and the cathode 304 is connected with the organic emitting layer 303. The organic emitting layer 303 emits light of a corresponding color under drive of the anode 301 and the cathode 304. The encapsulation structure layer 104 may include a first encapsulation layer 401, a second encapsulation layer 402, and a third encapsulation layer 403 which are stacked, the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, which may ensure that external water vapor cannot enter the light emitting structure layer 103.

In an exemplary implementation mode, the organic emitting layer 303 may include an Emitting Layer (EML) and any one or more of a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, one or more of hole injection layers, hole transport layers, electron block layers, hole block layers, electron transport layers, and electron injection layers of all sub-pixels may be connected together to form a common layer. Emitting layers of adjacent sub-pixels may be overlapped slightly, or may be isolated.

FIG. 4 is an equivalent circuit diagram of a pixel drive circuit. In an exemplary implementation mode, the pixel drive circuit may have a structure of 3T1C, 4T1C, 5T1C, 5T2C, 6T1C, 7T1C, or 8T1C. As shown in FIG. 4, the pixel drive circuit may include seven transistors (a first transistor T1 to a seventh transistor T7), one storage capacitor C. The pixel drive circuit may be connected with seven signal lines (a data signal line D, a scan signal line Gate, a reset signal line Reset, a light emitting signal line EM, an initial signal line INIT, a first power supply line VDD, and a second power supply line VSS).

In an exemplary implementation mode, the pixel drive circuit may include a first node N1, a second node N2, and a third node N3. Among them, the first node N1 is connected with a first electrode of the third transistor T3, a second electrode of the fourth transistor T4, and a second electrode of the fifth transistor T5 respectively. The second node N2 is connected with a second electrode of the first transistor, a first electrode of the second transistor T2, a control electrode of the third transistor T3, and a second terminal of the storage capacitor C respectively. The third node N3 is connected with a second electrode of the second transistor T2, a second electrode of the third transistor T3, and a first electrode of the sixth transistor T6 respectively.

In an exemplary implementation mode, a first terminal of the storage capacitor C is connected with the first power supply line VDD, and the second terminal of the storage capacitor C is connected with the second node N2, i.e., the second terminal of the storage capacitor C is connected with the control electrode of the third transistor T3.

A control electrode of the first transistor T1 is connected with the reset signal line Reset, a first electrode of the first transistor T1 is connected with the initial signal line INIT, and a second electrode of the first transistor T1 is connected with the second node N2. When a scan signal with an on-level is applied to the reset signal line Reset, the first transistor T1 transmits an initialization voltage to the control electrode of the third transistor T3, so as to initialize a charge amount of the control electrode of the third transistor T3.

A control electrode of the second transistor T2 is connected with the scan signal line Gate, a first electrode of the second transistor T2 is connected with the second node N2, and a second electrode of the second transistor T2 is connected with the third node N3. When a scan signal with an on-level is applied to the scan signal line Gate, the second transistor T2 enables the control electrode of the third transistor T3 to be connected with the second electrode of the third transistor T3.

The control electrode of the third transistor T3 is connected with the second node N2, i.e., the control electrode of the third transistor T3 is connected with the second terminal of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines a magnitude of a drive current flowing between the first power supply line VDD and the second power supply line VSS according to a potential difference between the control electrode and the first electrode of the third transistor T3.

A control electrode of the fourth transistor T4 is connected with the scan signal line Gate, a first electrode of the fourth transistor T4 is connected with the data signal line D, and a second electrode of the fourth transistor T4 is connected with the first node N1. The fourth transistor T4 may be referred to as a switching transistor, a scan transistor, etc., and the fourth transistor T4 enables a data voltage of the data signal line D to be input into the pixel drive circuit when a scan signal with an on-level is applied to the scan signal line Gate.

A control electrode of the fifth transistor T5 is connected with the light emitting signal line EM, a first electrode of the fifth transistor T5 is connected with the first power supply line VDD, and a second electrode of the fifth transistor T5 is connected with the first node N1. A control electrode of the sixth transistor T6 is connected with the light emitting signal line EM, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line EM, the fifth transistor T5 and the sixth transistor T6 enable the light emitting device to emit light by forming a drive current path between the first power supply line VDD and the second power supply line VSS.

A control electrode of the seventh transistor T7 is connected with the scan signal line Gate, a first electrode of the seventh transistor T7 is connected with the initial signal line INIT, and a second electrode of the seventh transistor T7 is connected with the first electrode of the light emitting device. When a scan signal with an on-level is applied to the scan signal line Gate, the seventh transistor T7 transmits an initialization voltage to the first electrode of the light emitting device so as to initialize a charge amount accumulated in the first electrode of the light emitting device or release the charge amount accumulated in the first electrode of the light emitting device.

In an exemplary implementation mode, a second electrode of the light emitting device is connected with the second power supply line VSS, a signal of the second power supply line VSS is a low-level signal, and a signal of the first power supply line VDD is a high-level signal continuously provided. The scan signal line Gate is a scan signal line in a pixel drive circuit of a present display row, and the reset signal line Reset is a scan signal line Gate in a pixel drive circuit of a previous display row. A reset signal line Reset of the present display row is the same signal line as a scan signal line Gate in the pixel drive circuit of the previous display row, so that signal lines of a display panel may be reduced and a narrow bezel of the display panel may be achieved.

Transistors may be divided into N-type transistors and P-type transistors according to characteristics of the transistors. When a transistor is a P-type transistor, its turn-on voltage is a low-level voltage (e.g., 0 V, −5 V, −10 V, or another suitable voltage), and its turn-off voltage is a high-level voltage (e.g., 5 V, 10 V, or another suitable voltage). When a transistor is an N-type transistor, its turn-on voltage is a high-level voltage (e.g., 5 V, 10 V, or another suitable voltage), and its turn-off voltage is a low-level voltage (e.g., 0 V, −5 V, −10 V, or another suitable voltage).

In an exemplary implementation mode, the first transistor T1 to the seventh transistor T7 may be P-type transistors, or may be N-type transistors. Use of a same type of transistors in a pixel drive circuit may simplify a process flow, reduce a process difficulty of a display panel, and improve a product yield. In some possible implementation modes, the first transistor T1 to the seventh transistor T7 may include a P-type transistor and an N-type transistor.

In an exemplary implementation mode, for the first transistor T1 to the seventh transistor T7, low temperature poly silicon thin film transistors may be used, or oxide thin film transistors may be used, or both a low temperature poly silicon thin film transistor and an oxide thin film transistor may be used. An active layer of a low temperature poly silicon thin film transistor is made of Low Temperature Poly Silicon (LTPS for short), and an active layer of an oxide thin film transistor is made of an oxide semiconductor (Oxide). A Low temperature poly silicon thin film transistor has advantages such as a high migration rate and fast charging, and an oxide thin film transistor has advantages such as a low leakage current. The low temperature poly silicon thin film transistor and the oxide thin film transistor are integrated on one display substrate to form a Low Temperature Polycrystalline Oxide (LTPO for short) display substrate, so that advantages of both the low temperature poly silicon thin film transistor and the oxide thin film transistor may be utilized, low-frequency drive may be achieved, power consumption may be decreased, and display quality may be improved.

In an exemplary implementation mode, the light emitting device may be an Organic Light Emitting Diode (OLED), including a first electrode (anode), an organic emitting layer, and a second electrode (cathode) that are stacked.

Figure 5:
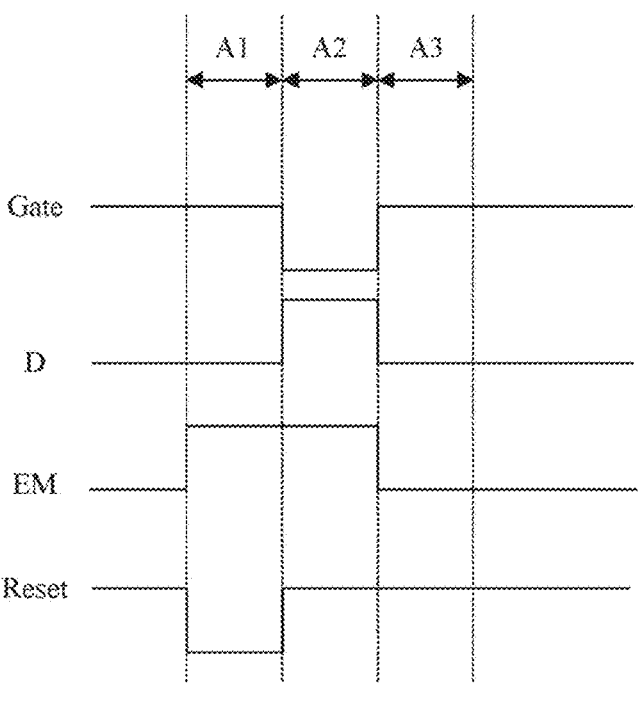
FIG. 5 is a working timing diagram of a pixel drive circuit.

FIG. 5 is a working timing diagram of a pixel drive circuit. An exemplary embodiment of the present disclosure will be described below through a working process of the pixel drive circuit exemplified in FIG. 4. The pixel drive circuit in FIG. 4 includes seven transistors (a first transistor T1 to a seventh transistor T7) and one storage capacitor C, and the seven transistors are all P-type transistors.

In an exemplary implementation mode, the working process of the pixel drive circuit may include following stages.

In a first stage A1, referred to as a reset stage, a signal of the reset signal line Reset is a low-level signal, and signals of the scan signal line Gate and the light emitting signal line EM are high-level signals. The signal of the reset signal line Reset is the low-level signal, so that the first transistor T1 is turned on, and a signal of the initial signal line INIT is provided to a first node N2 to initialize (reset) the storage capacitor C to clear original charges in the storage capacitor. The signals of the scan signal line Gate and the light emitting signal line EM are the high-level signals, so that the second transistor T2, the fourth transistor T4, the fifth transistor T5, the sixth transistor T6, and the seventh transistor T7 are turned off. In this stage, the OLED does not emit light.

In a second stage A2, referred to as a data writing stage or a threshold compensation stage, a signal of the scan signal line Gate is a low-level signal, signals of the reset signal line Reset and the light emitting signal line EM are high-level signals, and the data signal line D outputs a data voltage. In this stage, a second terminal of the storage capacitor C is at a low level, so the third transistor T3 is turned on. The signal of the scan signal line Gate is the low-level signal, so that the second transistor T2, the fourth transistor T4, and the seventh transistor T7 are turned on. The second transistor T2 and the fourth transistor T4 are turned on, so that the data voltage output by the data signal line D is provided to a second node N2 through the first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization and ensuring that the OLED does not emit light. A signal of the reset signal line Reset is a high-level signal, so that the first transistor T1 is turned off. A signal of the light emitting signal line EM is a high-level signal, so that the fifth transistor T5 and the sixth transistor T6 are turned off.

In a third stage A3, referred to as a light emitting stage, a signal of the light emitting signal line EM is a low-level signal, and signals of the scan signal line Gate and the reset signal line Reset are both high-level signals. The signal of the light emitting signal line EM is the low-level signal, so that the fifth transistor T5 and the sixth transistor T6 are turned on. A supply voltage output by the first power supply line VDD provides a drive voltage to the first electrode of the OLED through the turned-on fifth transistor T5, the third transistor T3, and the sixth transistor T6, to drive the OLED to emit light.

In a drive process of the pixel drive circuit, a drive current flowing through the third transistor T3 (drive transistor) is determined by a voltage difference between a gate electrode and the first electrode of the third transistor T3. The voltage of the second node N2 is Vdata−|Vth|, so the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is a drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

It may be seen from a derivation result of the above current formula that in the light emitting stage, the drive current of the third transistor T3 is not affected by the threshold voltage of the third transistor T3. Therefore, an influence of the threshold voltage of the third transistor T3 on the drive current is eliminated, which may ensure uniformity of display brightness of a display product, and improve a display effect of the whole display product.

Figure 6:
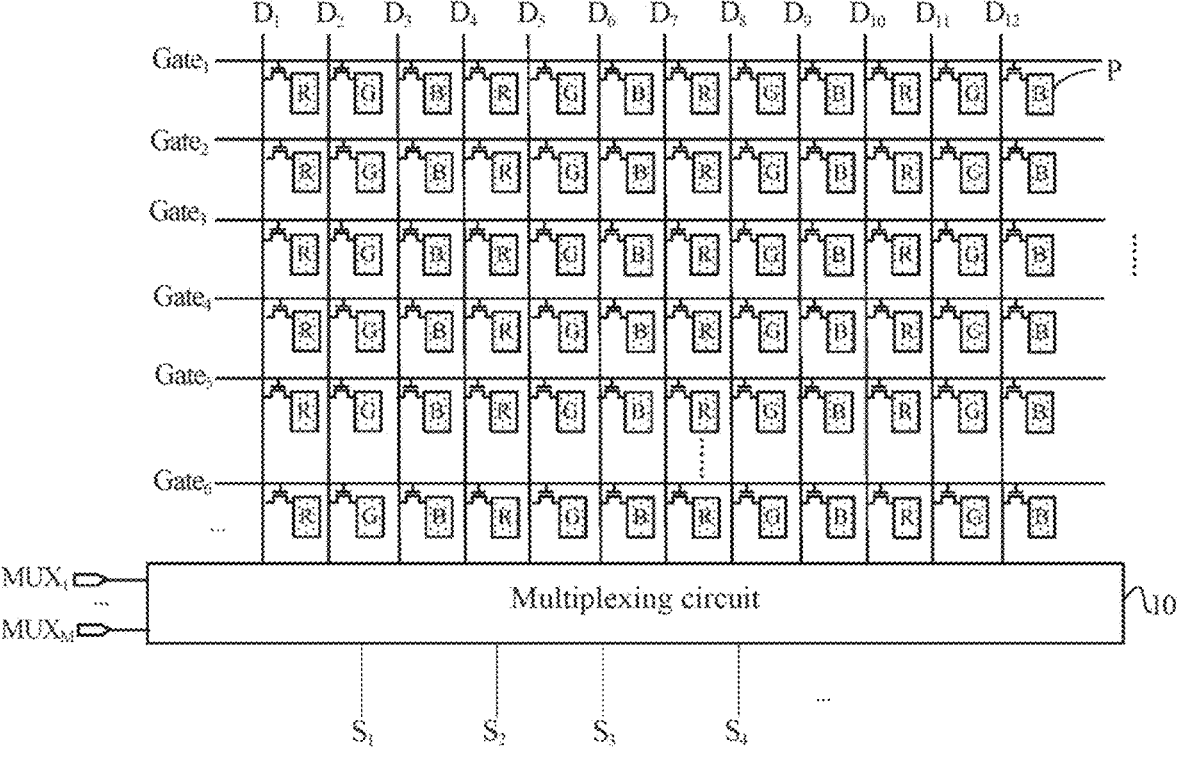
FIG. 6 is a schematic diagram of a structure of a display substrate according to an embodiment of the present disclosure.

FIG. 6 is a schematic diagram of a structure of a display substrate according to an embodiment of the present disclosure. As shown in FIG. 6, the display substrate according to the embodiment of the present disclosure may include a plurality of sub-pixels P arranged in an array, a multiplexing circuit MUX, a plurality of data signal lines D, a plurality of selection signal lines MUX, and a plurality of data transmission lines S. The plurality of sub-pixels include sub-pixels of a plurality of colors, and the data signal lines are electrically connected with the plurality of sub-pixels. $D_i$ in FIG. 6 denotes an i-th data signal line, $MUX_i$ denotes an i-th selection signal line, and $S_i$ denotes an i-th data transmission line.

In an exemplary implementation mode, the multiplexing circuit may include a plurality of multiplexing transistors, and a multiplexing transistor is electrically connected with a data transmission line, a selection signal line, and a data signal line, respectively. The multiplexing transistor is configured to transmit a signal of the data transmission line to the data signal line under control of the selection signal line.

In an exemplary implementation mode, the plurality of selection signal lines may be divided into a plurality of selection signal groups, at least one selection signal group includes a plurality of selection signal lines, different selection signal groups include different selection signal lines, and the selection signal group is electrically connected with a sub-pixel through a multiplexing transistor and a data signal line. Colors of sub-pixels electrically connected with a same selection signal group are the same, and colors of sub-pixels electrically connected with different selection signal groups are different. Effective time periods of any two selection signal groups in the plurality of selection signal groups are not overlapped. Among them, an effective time period of a selection signal group refers to a time period between a start time when a signal is an effective level signal at the earliest and an end time when a signal is an effective level signal at the latest in selection signal lines of the selection signal group.

In an exemplary implementation mode, as shown in FIG. 6, the display substrate according to the embodiment of the present disclosure may further include a scan signal line Gate, wherein a plurality of sub-pixels are electrically connected with the scan signal line.

In an exemplary implementation mode, the display substrate includes a display region and a non-display region, wherein a scan signal line, a data signal line, and a sub-pixel are located in the display region, and a multiplexing circuit is located in the non-display region.

In an exemplary implementation mode, the display substrate further includes a source drive chip located in the non-display region, and the source drive chip is electrically connected with a plurality of data transmission lines.

For the display substrate according to the embodiment of the present disclosure, a Low Temperature Poly Silicon (LTPS for short) process or an oxide process may be adopted, and the present disclosure does not make any limitation on this.

In the present disclosure, by providing that the colors of the sub-pixels electrically connected with the same selection signal group are the same, the colors of the sub-pixels electrically connected with different selection signal groups are different, and the effective time periods of any two selection signal groups in the plurality of selection signal groups are not overlapped, which may ensure that occurrence time when signals of a plurality of selection signal lines in selection signal groups of sub-pixels of a same color are effective level signals are controlled to be adjacent, so that a time difference of stored data voltages on a plurality of data signal lines electrically connected with a same selection signal group is minimum, a problem of pixel brightness difference caused by sequential opening of a plurality of selection signal lines may be alleviated or avoided, poor bright and dark vertical stripes may be eliminated in macro vision, and a display effect of the display substrate may be improved.

In an exemplary implementation mode, as shown in FIG. 6, sub-pixels may include a first color sub-pixel, a second color sub-pixel, and a third color sub-pixel, a first color, a second color, and a third color are different colors and are one of red, blue, and green, respectively. The first color may be red, the second color may be green, and the third color may be blue; or the first color may be red, the second color may be blue, and the third color may be green; or the first color may be blue, the second color may be red, and the third color may be green; or the first color may be blue, the second color may be green, and the third color may be red; or the first color may be green, the second color may be blue, and the third color may be red; or the first color may be green, the second color may be red, and the third color may be blue.

In an exemplary implementation mode, as shown in FIG. 6, an i-th data signal line is electrically connected with an i-th column of sub-pixels, a (3i−2)-th column of sub-pixels are first color sub-pixels, a (3i−1)-th column of sub-pixels are second color sub-pixels, and a 3i-th column of sub-pixels are third color sub-pixels, wherein 1≤i≤N/3, / is a quotient operation, N is a quantity of data signal lines, and N may be a positive integer greater than or equal to 6. Exemplarily, colors of a first column of sub-pixels, a fourth column of sub-pixels, a seventh column of sub-pixels and the like are the first color, colors of a second column of sub-pixels, a fifth column of sub-pixels, an eighth column of sub-pixels and the like are the second color, and colors of a third column of sub-pixels, a sixth column of sub-pixels, a ninth column of sub-pixels and the like are the third color. FIG. 6 is illustrated by taking a case that the first color is red, the second color is green, and the third color is blue as an example, and the present disclosure does not make any limitation on this.

In an exemplary implementation mode, the quotient operation/has a following definition: when a=b×c+h, a, b, and c satisfy a/b=c, wherein a, b, c, and h are positive integers, h is greater than or equal to 0, and less than b, for example, 1/6=0, 2/6=0, 3/6=0, 4/6=0, 5/6=0, 6/6=1, 7/6=1, 8/6=1, 12/6-2, 13/6=2, 14/6=2, 15/6=2, 14/9=2, and so on.

In an exemplary implementation mode, the plurality of selection signal groups may include a first selection signal group, a second selection signal group, and a third selection signal group. A sub-pixel electrically connected with the first selection signal group is a first color sub-pixel, a sub-pixel electrically connected with the second selection signal group is a second color sub-pixel, and a sub-pixel electrically connected with the third selection signal group is a third color sub-pixel.

In an exemplary implementation mode, due to characteristics of a material of a light emitting device in the display substrate, an effective time period of a selection signal group electrically connected with a blue sub-pixel may be made earlier than effective time periods of a selection signal group electrically connected with a red sub-pixel and a selection signal group electrically connected with a green sub-pixel.

In an exemplary implementation mode, an effective time period of a selection signal group electrically connected with a red sub-pixel is earlier than an effective time period of a selection signal group electrically connected with a blue sub-pixel and a green sub-pixel, or an effective time period of a selection signal group electrically connected with a green sub-pixel may be made earlier than an effective time period of a selection signal group electrically connected with a blue sub-pixel and a red sub-pixel. A sequence of occurrence of effective time periods for selecting signals may be determined according to the characteristics of the light emitting device, which is not limited in the present disclosure.

Figure 7:
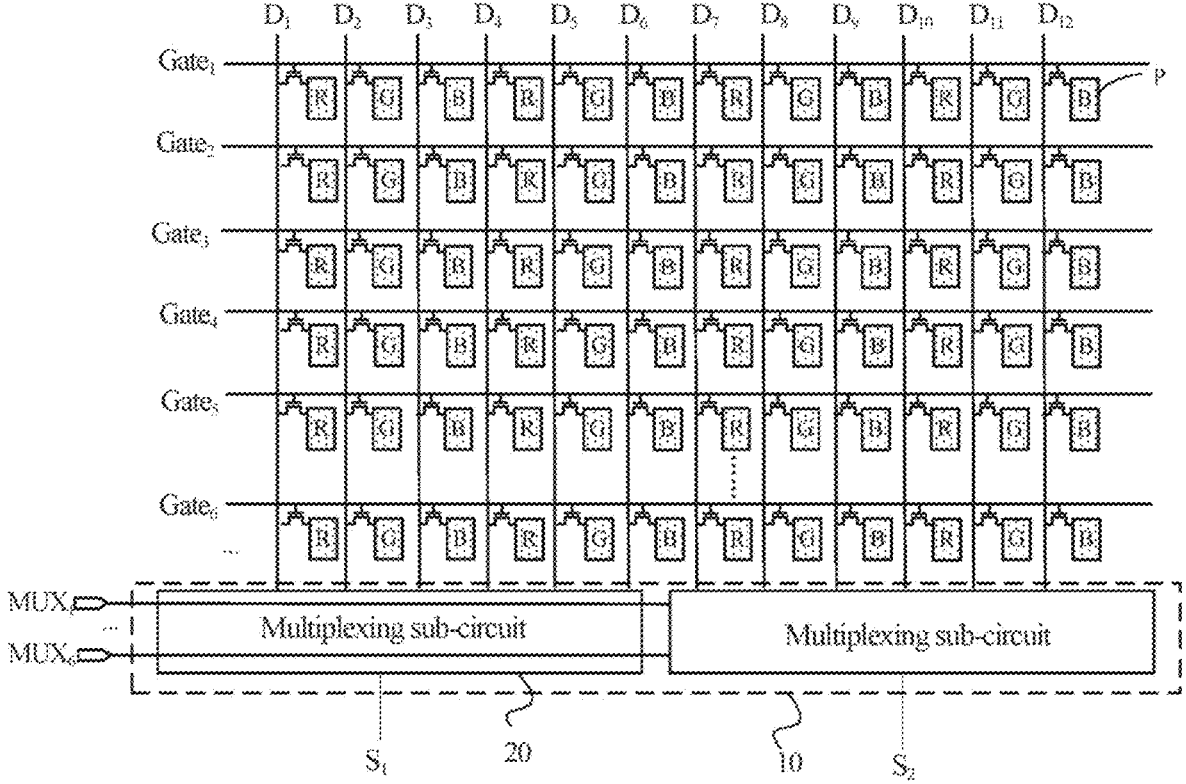
FIG. 7 is a circuit structure diagram of a multiplexing circuit.
Figure 8:
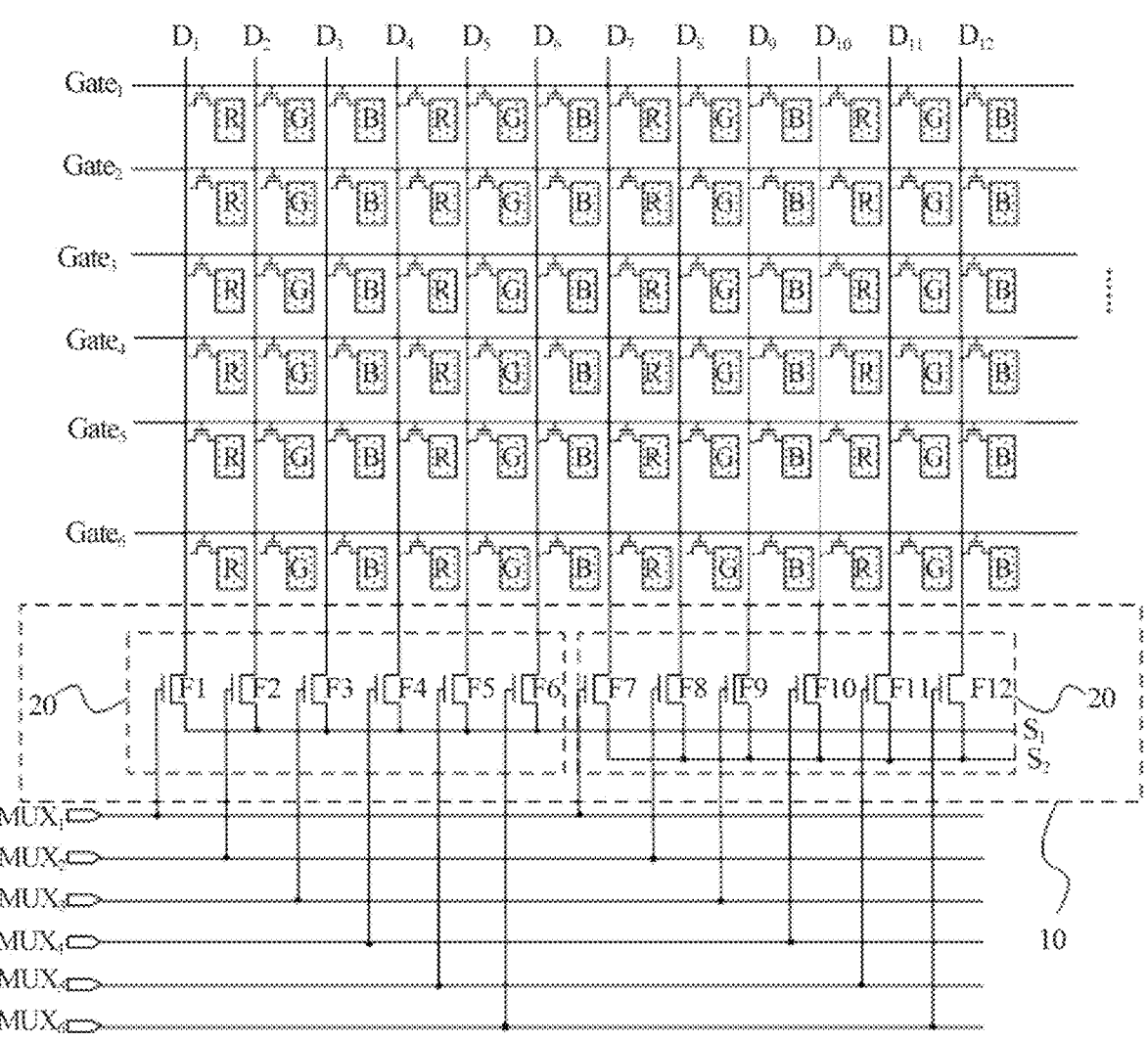
FIG. 8 is a diagram of an equivalent circuit of a multiplexing circuit.
Figure 9:
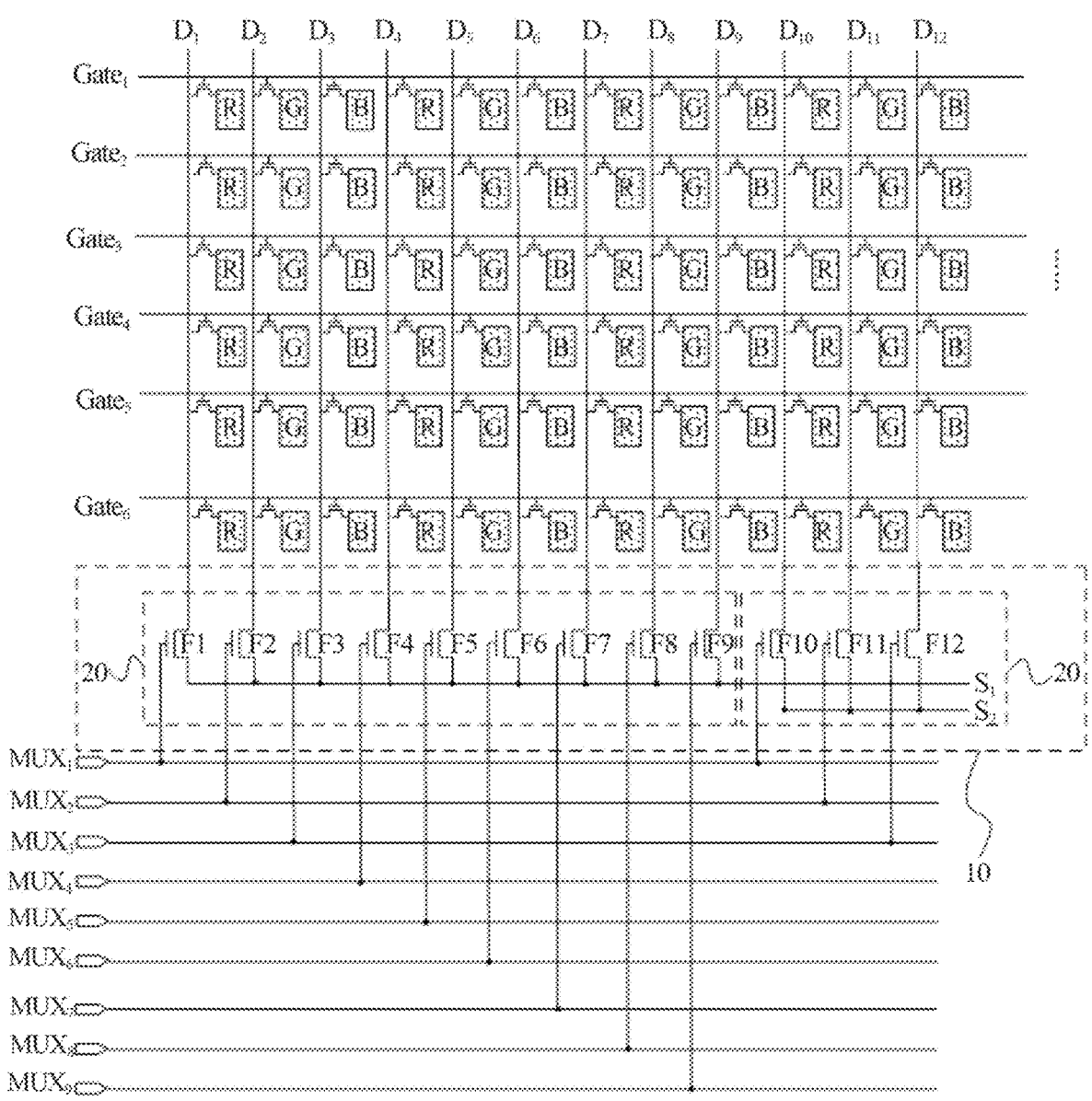
FIG. 9 is a diagram of an equivalent circuit of another multiplexing circuit.
Figure 10:
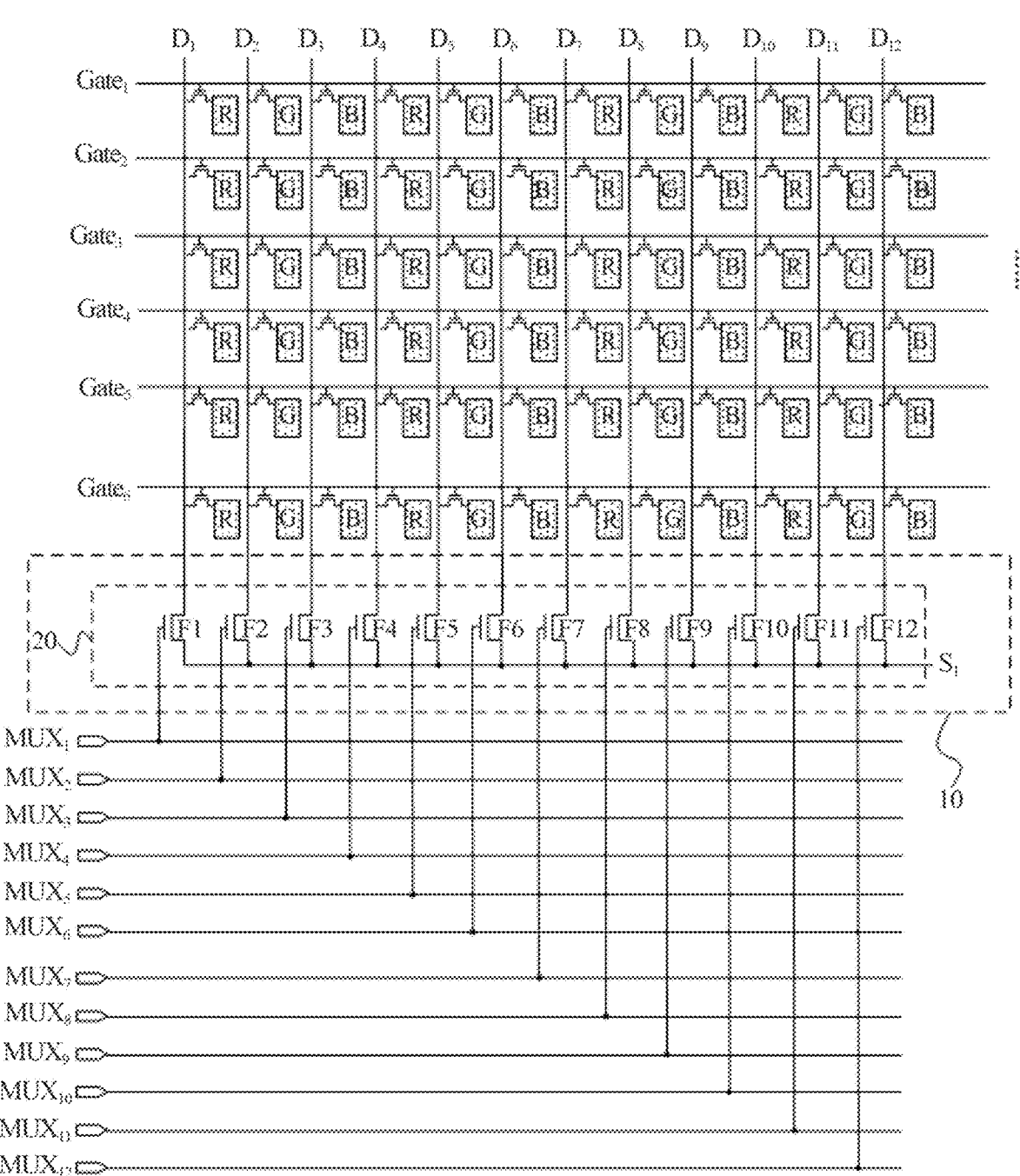
FIG. 10 is a diagram of an equivalent circuit of yet another multiplexing circuit.

In an exemplary implementation mode, FIG. 7 is a circuit structure diagram of a multiplexing circuit, FIG. 8 is an equivalent circuit diagram of one multiplexing circuit, FIG. 9 is an equivalent circuit diagram of another multiplexing circuit, and FIG. 10 is an equivalent circuit diagram of yet another multiplexing circuit. As shown in FIGS. 7 to 10, a multiplexing circuit 10 may include N/M multiplexing sub-circuits 20; a j-th multiplexing sub-circuit is electrically connected with M data signal lines, a j-th data transmission line $S_j$, and M selection signal lines $MUX_1$ to $MUX_M$, wherein M is a quantity of selection signal lines, j=1, 2, . . . , N/M.

In an exemplary implementation mode, the j-th multiplexing sub-circuit may be electrically connected with an (M×(j−1)+1)-th data signal line to an (M×j)-th data signal line.

Exemplarily, a first multiplexing sub-circuit is electrically connected with a first data signal line to an M-th data signal line, a first data transmission line and a first selection signal line to an M-th selection signal line, a second multiplexing sub-circuit is electrically connected with an (M+1)-th data signal line to a (2M)-th data signal line, a second data transmission line and a first selection signal line to an M-th selection signal line, and so on, and an (N/M)-th multiplexing sub-circuit is electrically connected with an (N−M+1)-th data signal line to an N-th data signal line, an (N/M)-th data transmission line and a first selection signal line to an M-th selection signal line, respectively.

In an exemplary implementation mode, M=3×S, S is a positive integer greater than or equal to 2, and M is a positive integer greater than or equal to 6 and an integer multiple of 3. Exemplarily, M may be 6, 9, or 12, which is not limited in the present disclosure. FIG. 8 is illustrated by taking M=6 as an example, FIG. 9 is illustrated by taking M=9 as an example, and FIG. 10 is illustrated by taking M=12 as an example.

Exemplarily, as shown in FIG. 8, when M=6, a first multiplexing sub-circuit is electrically connected with a first data signal line to a sixth data signal line, a first data transmission line and a first selection signal line to a sixth selection signal line, respectively, a second multiplexing sub-circuit is electrically connected with a seventh data signal line to a twelfth data signal line, a second data transmission line and the first selection signal line to the sixth selection signal line, respectively, and so on, and an (N/6)-th multiplexing sub-circuit is electrically connected with an (N−5)-th data signal line to an N-th data signal line, an (N/6)-th data transmission line and the first selection signal line to the sixth selection signal line, respectively.

Exemplarily, as shown in FIG. 9, when M=9, a first multiplexing sub-circuit is electrically connected with a first data signal line to a ninth data signal line, a first data transmission line and a first selection signal line to a ninth selection signal line, respectively, a second multiplexing sub-circuit is electrically connected with a tenth data signal line to an eighteenth data signal line, a second data transmission line and the first selection signal line to the ninth selection signal line, respectively, and so on, and an (N/9)-th multiplexing sub-circuit is electrically connected with an (N−8)-th data signal line to an N-th data signal line, an (N/9)-th data transmission line and the first selection signal line to the ninth selection signal line, respectively.

Exemplarily, as shown in FIG. 10, when M=12, a first multiplexing sub-circuit is electrically connected with a first data signal line to a twelfth data signal line, a first data transmission line and a first selection signal line to a twelfth selection signal line, respectively, a second multiplexing sub-circuit is electrically connected with a thirteenth data signal line to a twenty-fourth data signal line, a second data transmission line and the first selection signal line to the ninth selection signal line, respectively, and so on, and an (N/12)-th multiplexing sub-circuit is electrically connected with an (N−11)-th data signal line to an N-th data signal line, an (N/12)-th data transmission line and the first selection signal line to the twelfth selection signal line, respectively.

In an exemplary implementation mode, as shown in FIGS. 8 to 10, a quantity of reset transistors may be the same as a quantity of data signal lines, that is, a quantity of multiplexing transistors may be N.

In an exemplary implementation mode, as shown in FIGS. 8 to 10, a control electrode of an n-th multiplexing transistor Fn is electrically connected with an l-th selection signal line $MUX_l$, a first electrode of the n-th multiplexing transistor Fn is electrically connected with an n-th data signal line $D_n$, and a second electrode of the n-th multiplexing transistor Fn is electrically connected with a w-th data transmission line $S_w$, and % is a remainder operation, n=1, 2, . . . , N.

In an exemplary implementation mode, l may satisfy a following formula.

$$l = \begin{cases} M, & n \text{ is an integer multiple of } M \\ n \% M, & n \text{ is not an integer multiple of } M \end{cases}$$

In an exemplary implementation mode, the remainder operation % has a following definition: when a=b×c+h, a, c, and h satisfies a % b=h, wherein a, b, c, and h are positive integers, h is greater than or equal to 0, and less than b, for example, 1%6=1, 2%6=2, 3%6=3, 4%6=4, 5%6=5, 6%6=0, 7%6=1, 8%6=2, 12%6=0, 13%6=1, 3%9=3, 10%9=1, and so on.

Exemplarily, taking M=6 as an example, when n is a multiple of 6, such as 6, 12, and 18, etc., l=6, that is to say, control electrodes of a sixth multiplexing transistor, a twelfth multiplexing transistor, an eighteenth multiplexing transistor, etc. are electrically connected with a sixth selection signal line, and when n is not a multiple of 6, l=n%M, that is to say, control electrodes of all multiplexing transistors satisfying n%6=1, such as a first multiplexing transistor, a seventh multiplexing transistor, and a thirteenth multiplexing transistor, etc., are electrically connected with a first selection signal line, control electrodes of all multiplexing transistors satisfying n%6=2, such as a second multiplexing transistor, an eighth multiplexing transistor, and a fourteenth multiplexing transistor, etc., are electrically connected with a second selection signal line, control electrodes of all multiplexing transistors satisfying n%6=3, such as a third multiplexing transistor, a ninth multiplexing transistor, and a fifteenth multiplexing transistor, etc., are electrically connected with a third selection signal line, control electrodes of all multiplexing transistors satisfying n%6=4, such as a fourth multiplexing transistor, a tenth multiplexing transistor, and a sixteenth multiplexing transistor, etc., are electrically connected with a fourth selection signal line, and control electrodes of all multiplexing transistors satisfying n%6=5, such as a fifth multiplexing transistor, an eleventh multiplexing transistor, and a seventeenth multiplexing transistor, etc., are electrically connected with a fifth selection signal line, when M=9 or 12, and so on, which is not limited in the present disclosure.

In an exemplary implementation mode, w satisfies a following formula.

$$w = \begin{cases} (n/M), & n \text{ is an integer multiple of } M \\ (n/M) + 1, & n \text{ is not an integer multiple of } M \end{cases}$$

Exemplarily, taking M=6 as an example, when n is an integral multiple of 6, a second electrode of a sixth multiplexing transistor is electrically connected with a (6/6)-th data transmission line, i.e., a first data transmission line, a second electrode of a twelfth multiplexing transistor is electrically connected with a (12/6)-th data transmission line, i.e., a second data transmission line, a second electrode of an eighteenth multiplexing transistor is electrically connected with a (18/6)-th data transmission line, and so on. When n is not an integral multiple of 6, second electrodes of a first multiplexing transistor to a fifth multiplexing transistor are all electrically connected with a first data transmission line, second electrodes of a seventh multiplexing transistor to an eleventh multiplexing transistor are all electrically connected with a second data transmission line, and so on, and when M=9 or 12, and so on, which is not limited in the present disclosure.

In an exemplary implementation mode, the j-th multiplexing sub-circuit may include: an (M×(j−1)+1)-th multiplexing transistor to an (M×j)-th multiplexing transistor. Exemplarily, when M=6, a first multiplexing sub-circuit includes a first multiplexing transistor to a sixth multiplexing transistor, a second multiplexing sub-circuit includes a seventh multiplexing transistor to a twelfth multiplexing transistor, and so on. When M=9, a first multiplexing sub-circuit includes a first multiplexing transistor to a ninth multiplexing transistor, a second multiplexing sub-circuit includes a tenth multiplexing transistor to an eighteenth multiplexing transistor, and so on. When M=12, a first multiplexing sub-circuit includes a first multiplexing transistor to a twelfth multiplexing transistor, a second multiplexing sub-circuit includes a thirteenth multiplexing transistor to a twenty-fourth multiplexing transistor, and so on.

In an exemplary implementation mode, N multiplexing transistors may all be N-type transistors or all P-type transistors. The present disclosure does not make any limitation on this.

In an exemplary implementation mode, as shown in FIG. 8, when M=6, a first selection signal group electrically connected with a first color sub-pixel may include a first selection signal line $MUX_1$ and a fourth selection signal line $MUX_4$, a second selection signal group electrically connected with a second color sub-pixel may include a second selection signal line $MUX_2$ and a fifth selection signal line $MUX_5$, and a third selection signal group electrically connected with a third color sub-pixel may include a third selection signal line $MUX_3$ and a sixth selection signal line $MUX_6$.

In an exemplary implementation mode, as shown in FIG. 8, a control electrode of a first multiplexing transistor F1 is electrically connected with a first selection signal line $MUX_1$, a first electrode of the first multiplexing transistor F1 is electrically connected with a first data signal line $D_1$, a second electrode of the first multiplexing transistor F1 is electrically connected with a first data transmission line $S_1$, a control electrode of a second multiplexing transistor F2 is electrically connected with a second selection signal line $MUX_2$, a first electrode of the second multiplexing transistor F2 is electrically connected with a second data signal line $D_2$, a second electrode of the second multiplexing transistor F2 is electrically connected with the first data transmission line $S_1$, a control electrode of a third multiplexing transistor F3 is electrically connected with a third selection signal line $MUX_3$, a first electrode of the third multiplexing transistor F3 is electrically connected with a third data signal line $D_3$, a second electrode of the third multiplexing transistor F3 is electrically connected with the first data transmission line $S_1$, a control electrode of a fourth multiplexing transistor F4 is electrically connected with a fourth selection signal line $MUX_4$, a first electrode of the fourth multiplexing transistor F4 is electrically connected with a fourth data signal line $D_4$, a second electrode of the fourth multiplexing transistor F4 is electrically connected with the first data transmission line $S_1$, a control electrode of a fifth multiplexing transistor F5 is electrically connected with a fifth selection signal line $MUX_5$, a first electrode of the fifth multiplexing transistor F5 is electrically connected with a fifth data signal line $D_5$, a second electrode of the fifth multiplexing transistor F5 is electrically connected with the first data transmission line $S_1$, a control electrode of a sixth multiplexing transistor F6 is electrically connected with a sixth selection signal line $MUX_6$, a first electrode of the sixth multiplexing transistor F6 is electrically connected with a sixth data signal line $D_6$, a second electrode of the sixth multiplexing transistor F6 is electrically connected with the first data transmission line $S_1$, a control electrode of a seventh multiplexing transistor F7 is electrically connected with the first selection signal line $MUX_1$, a first electrode of the seventh multiplexing transistor F7 is electrically connected with a seventh data signal line $D_7$, a second electrode of the seventh multiplexing transistor F7 is electrically connected with the second data transmission line $S_2$, a control electrode of an eighth multiplexing transistor F8 is electrically connected with the second selection signal line $MUX_2$, a first electrode of the eighth multiplexing transistor F8 is electrically connected with an eighth data signal line $D_8$, a second electrode of the eighth multiplexing transistor F8 is electrically connected with the second data transmission line $S_2$, a control electrode of a ninth multiplexing transistor F9 is electrically connected with the third selection signal line $MUX_3$, a first electrode of the ninth multiplexing transistor F9 is electrically connected with a ninth data signal line $D_9$, a second electrode of the ninth multiplexing transistor F9 is electrically connected with the second data transmission line $S_2$, a control electrode of a tenth multiplexing transistor F10 is electrically connected with the fourth selection signal line $MUX_4$, a first electrode of the tenth multiplexing transistor F10 is electrically connected with a tenth data signal line $D_{10}$, a second electrode of the tenth multiplexing transistor F10 is electrically connected with the second data transmission line $S_2$, a control electrode of an eleventh multiplexing transistor F10 is electrically connected with the fifth selection signal line $MUX_5$, a first electrode of the eleventh multiplexing transistor F11 is electrically connected with an eleventh data signal line $D_{11}$, a second electrode of the eleventh multiplexing transistor F11 is electrically connected with the second data transmission line $S_2$, a control electrode of a twelfth multiplexing transistor F12 is electrically connected with the sixth selection signal line $MUX_6$, a first electrode of the twelfth multiplexing transistor F12 is electrically connected with a twelfth data signal line $D_{12}$, a second electrode of the twelfth multiplexing transistor F12 is electrically connected with the second data transmission line $S_2$, and so on.

In an exemplary implementation mode, as shown in FIG. 9, when M=9, a first selection signal group electrically connected with a first color sub-pixel may include a first selection signal line $MUX_1$, a fourth selection signal line $MUX_4$, and a seventh selection signal line $MUX_7$, a second selection signal group electrically connected with a second color sub-pixel may include a second selection signal line $MUX_2$, a fifth selection signal line $MUX_5$, and an eighth selection signal line $MUX_8$, and a third selection signal group electrically connected with a third color sub-pixel may include a third selection signal line $MUX_3$, a sixth selection signal line $MUX_6$, and a ninth selection signal line $MUX_9$.

In an exemplary implementation mode, as shown in FIG. 9, a control electrode of a first multiplexing transistor F1 is electrically connected with a first selection signal line $MUX_1$, a first electrode of the first multiplexing transistor F1 is electrically connected with a first data signal line $D_1$, a second electrode of the first multiplexing transistor F1 is electrically connected with a first data transmission line $S_1$, a control electrode of a second multiplexing transistor F2 is electrically connected with a second selection signal line $MUX_2$, a first electrode of the second multiplexing transistor F2 is electrically connected with a second data signal line $D_2$, a second electrode of the second multiplexing transistor F2 is electrically connected with the first data transmission line $S_1$, a control electrode of a third multiplexing transistor F3 is electrically connected with a third selection signal line $MUX_3$, a first electrode of the third multiplexing transistor F3 is electrically connected with a third data signal line $D_3$, a second electrode of the third multiplexing transistor F3 is electrically connected with the first data transmission line $S_1$, a control electrode of a fourth multiplexing transistor F4 is electrically connected with a fourth selection signal line $MUX_4$, a first electrode of the fourth multiplexing transistor F4 is electrically connected with a fourth data signal line $D_4$, a second electrode of the fourth multiplexing transistor F4 is electrically connected with the first data transmission line $S_1$, a control electrode of a fifth multiplexing transistor F5 is electrically connected with a fifth selection signal line $MUX_5$, a first electrode of the fifth multiplexing transistor F5 is electrically connected with a fifth data signal line $D_5$, a second electrode of the fifth multiplexing transistor F5 is electrically connected with the first data transmission line $S_1$, a control electrode of a sixth multiplexing transistor F6 is electrically connected with a sixth selection signal line $MUX_6$, a first electrode of the sixth multiplexing transistor F6 is electrically connected with a sixth data signal line $D_6$, a second electrode of the sixth multiplexing transistor F6 is electrically connected with the first data transmission line $S_1$, a control electrode of a seventh multiplexing transistor F7 is electrically connected with a seventh selection signal line $MUX_7$, a first electrode of the seventh multiplexing transistor F7 is electrically connected with a seventh data signal line $D_7$, a second electrode of the seventh multiplexing transistor F7 is electrically connected with the first data transmission line $S_1$, a control electrode of an eighth multiplexing transistor F8 is electrically connected with an eighth selection signal $MUX_8$, a first electrode of the eighth multiplexing transistor F8 is electrically connected with an eighth data signal line $D_8$, a second electrode of the eighth multiplexing transistor F8 is electrically connected with the first data transmission line $S_1$, a control electrode of a ninth multiplexing transistor F9 is electrically connected with a ninth selection signal line $MUX_9$, a first electrode of the ninth multiplexing transistor F9 is electrically connected with a ninth data signal line $D_9$, a second electrode of the ninth multiplexing transistor F9 is electrically connected with the first data transmission line $S_1$, a control electrode of a tenth multiplexing transistor F10 is electrically connected with the first selection signal line $MUX_1$, a first electrode of the tenth multiplexing transistor F10 is electrically connected with a tenth data signal line $D_{10}$, a second electrode of the tenth multiplexing transistor F10 is electrically connected with the second data transmission line $S_2$, a control electrode of an eleventh multiplexing transistor F11 is electrically connected with the second selection signal line $MUX_2$, a first electrode of the eleventh multiplexing transistor F11 is electrically connected with an eleventh data signal line $D_{11}$, a second electrode of the eleventh multiplexing transistor F11 is electrically connected with the second data transmission line $S_2$, a control electrode of a twelfth multiplexing transistor F12 is electrically connected with the third selection signal line $MUX_3$, a first electrode of the twelfth multiplexing transistor F12 is electrically connected with a twelfth data signal line $D_{12}$, a second electrode of the twelfth multiplexing transistor F12 is electrically connected with the second data transmission line $S_2$, and so on.

In an exemplary implementation mode, as shown in FIG. 10, when M=12, a first selection signal group may include a first selection signal line $MUX_1$, a fourth selection signal line $MUX_4$, a seventh selection signal line $MUX_7$, and a tenth selection signal line $MUX_{10}$, a second selection signal group may include a second selection signal line $MUX_2$, a fifth selection signal line $MUX_5$, an eighth selection signal line $MUX_8$, and an eleventh selection signal line $MUX_{11}$, and a third selection signal group may include a third selection signal line $MUX_3$, a sixth selection signal line $MUX_6$, a ninth selection signal line $MUX_9$, and a twelfth selection signal line $MUX_{12}$.

In an exemplary implementation mode, as shown in FIG. 10, a control electrode of a first multiplexing transistor F1 is electrically connected with a first selection signal line $MUX_1$, a first electrode of the first multiplexing transistor F1 is electrically connected with a first data signal line $D_1$, a second electrode of the first multiplexing transistor F1 is electrically connected with a first data transmission line $S_1$, a control electrode of a second multiplexing transistor F2 is electrically connected with a second selection signal line $MUX_2$, a first electrode of the second multiplexing transistor F2 is electrically connected with a second data signal line $D_2$, a second electrode of the second multiplexing transistor F2 is electrically connected with the first data transmission line $S_1$, a control electrode of a third multiplexing transistor F3 is electrically connected with a third selection signal line $MUX_3$, a first electrode of the third multiplexing transistor F3 is electrically connected with a third data signal line $D_3$, a second electrode of the third multiplexing transistor F3 is electrically connected with the first data transmission line $S_1$, a control electrode of a fourth multiplexing transistor F4 is electrically connected with a fourth selection signal line $MUX_4$, a first electrode of the fourth multiplexing transistor F4 is electrically connected with a fourth data signal line $D_4$, a second electrode of the fourth multiplexing transistor F4 is electrically connected with the first data transmission line $S_1$, a control electrode of a fifth multiplexing transistor F5 is electrically connected with a fifth selection signal line $MUX_5$, a first electrode of the fifth multiplexing transistor F5 is electrically connected with a fifth data signal line $D_5$, a second electrode of the fifth multiplexing transistor F5 is electrically connected with the first data transmission line $S_1$, a control electrode of a sixth multiplexing transistor F6 is electrically connected with a sixth selection signal line $MUX_6$, a first electrode of the sixth multiplexing transistor F6 is electrically connected with a sixth data signal line $D_6$, a second electrode of the sixth multiplexing transistor F6 is electrically connected with the first data transmission line $S_1$, a control electrode of a seventh multiplexing transistor F7 is electrically connected with a seventh selection signal line $MUX_7$, a first electrode of the seventh multiplexing transistor F7 is electrically connected with a seventh data signal line $D_7$, a second electrode of the seventh multiplexing transistor F7 is electrically connected with the first data transmission line $S_1$, a control electrode of an eighth multiplexing transistor F8 is electrically connected with an eighth selection signal line $MUX_8$, a first electrode of the eighth multiplexing transistor F8 is electrically connected with an eighth data signal line $D_8$, a second electrode of the eighth multiplexing transistor F8 is electrically connected with the first data transmission line $S_1$, a control electrode of a ninth multiplexing transistor F9 is electrically connected with a ninth selection signal line $MUX_9$, a first electrode of the ninth multiplexing transistor F9 is electrically connected with a ninth data signal line $D_9$, a second electrode of the ninth multiplexing transistor F9 is electrically connected with the first data transmission line $S_1$, a control electrode of a tenth multiplexing transistor F10 is electrically connected with a tenth selection signal line $MUX_{10}$, a first electrode of the tenth multiplexing transistor F10 is electrically connected with a tenth data signal line $D_{10}$, a second electrode of the tenth multiplexing transistor F10 is electrically connected with the first data transmission line $S_1$, a control electrode of an eleventh multiplexing transistor F11 is electrically connected with an eleventh selection signal line $MUX_{11}$, a first electrode of the eleventh multiplexing transistor F11 is electrically connected with an eleventh data signal line $D_{11}$, a second electrode of the eleventh multiplexing transistor F11 is electrically connected with the first data transmission line $S_1$, a control electrode of a twelfth multiplexing transistor F12 is electrically with a twelfth selection signal line $MUX_{12}$, a first electrode of the twelfth multiplexing transistor F12 is electrically connected with a twelfth data signal line $D_{12}$, a second electrode of the twelfth multiplexing transistor F12 is electrically connected with the first data transmission line $S_1$, and so on.

Figure 11:
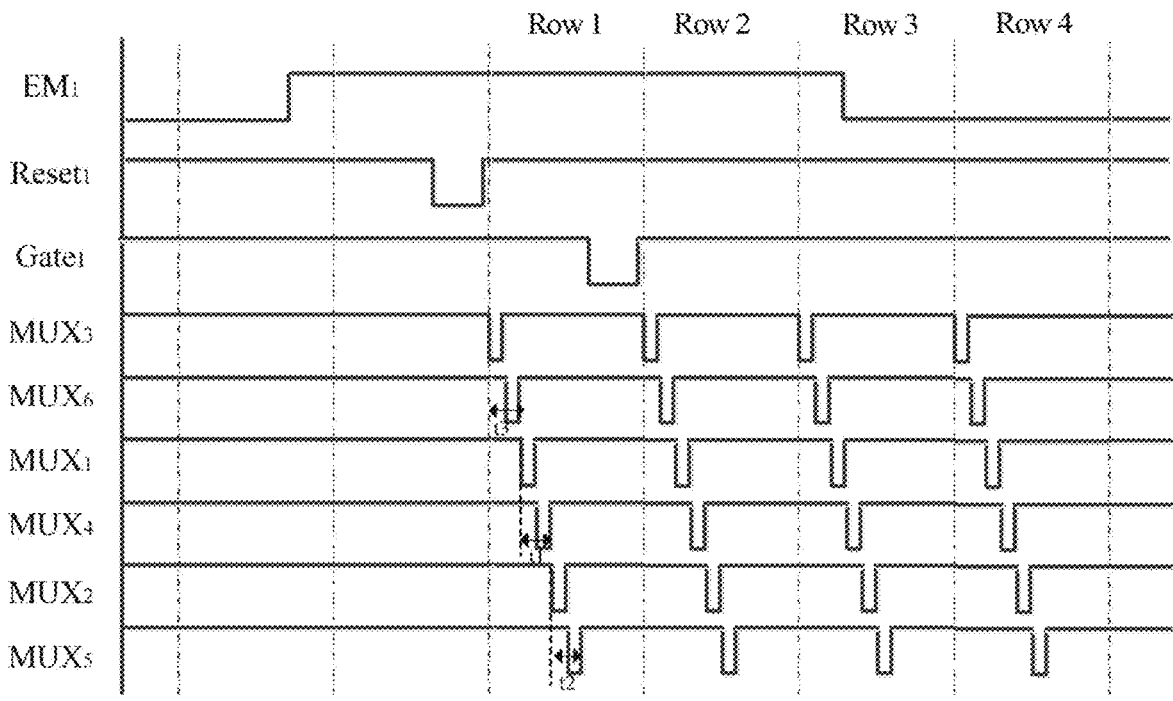
FIG. 11 is a first working timing diagram of a display substrate.
Figure 12:
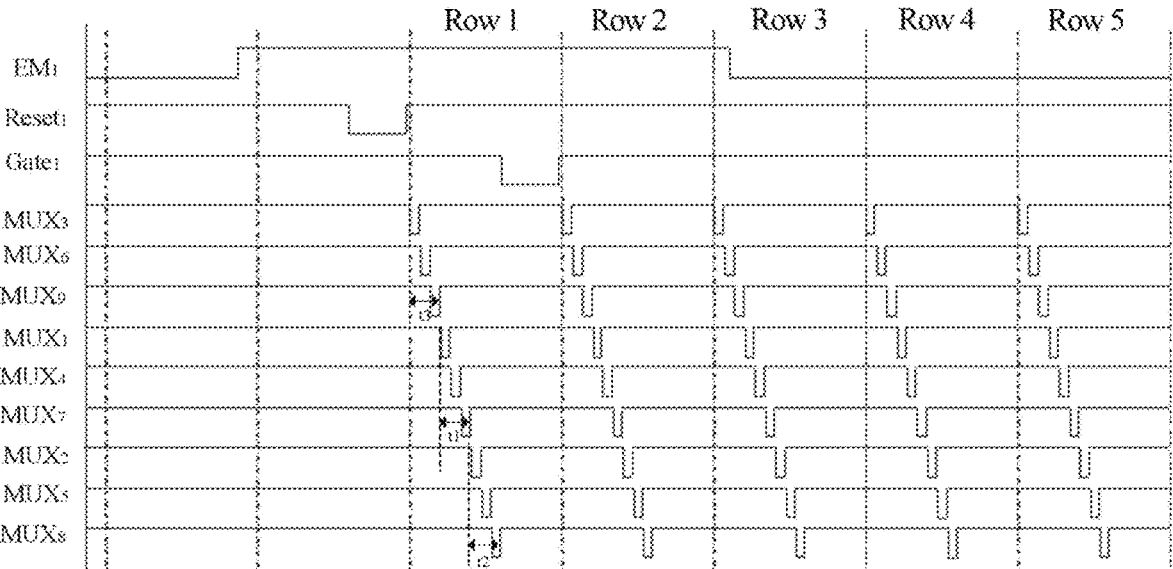
FIG. 12 is a second working timing diagram of the display substrate.
Figure 13:
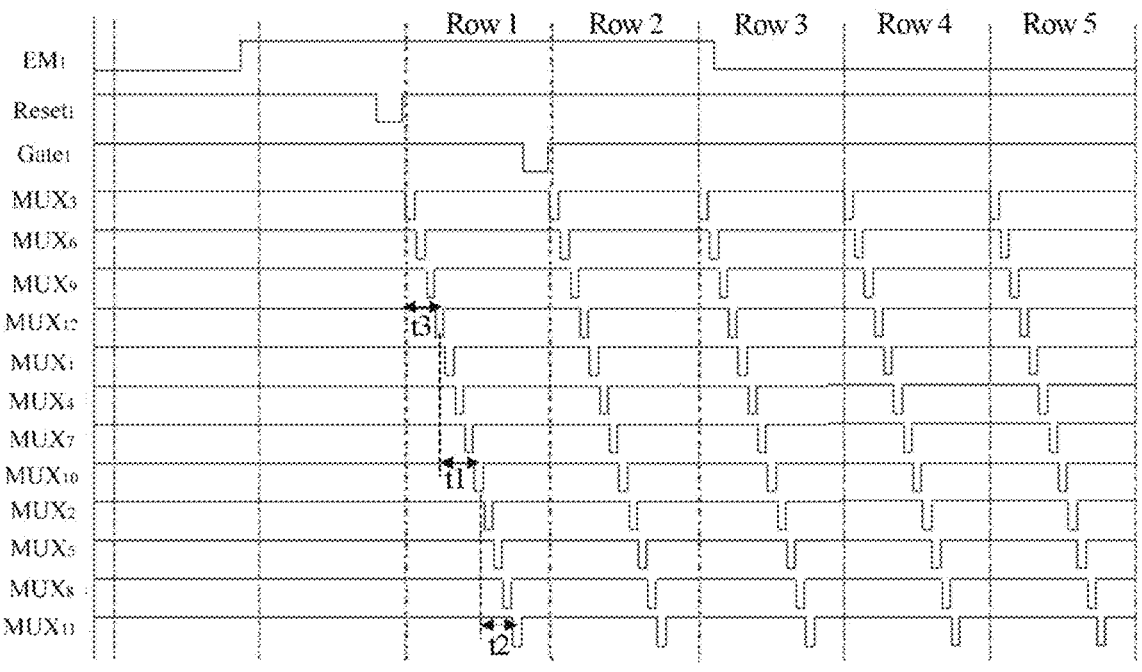
FIG. 13 is a third working timing diagram of the display substrate.
Figure 14:
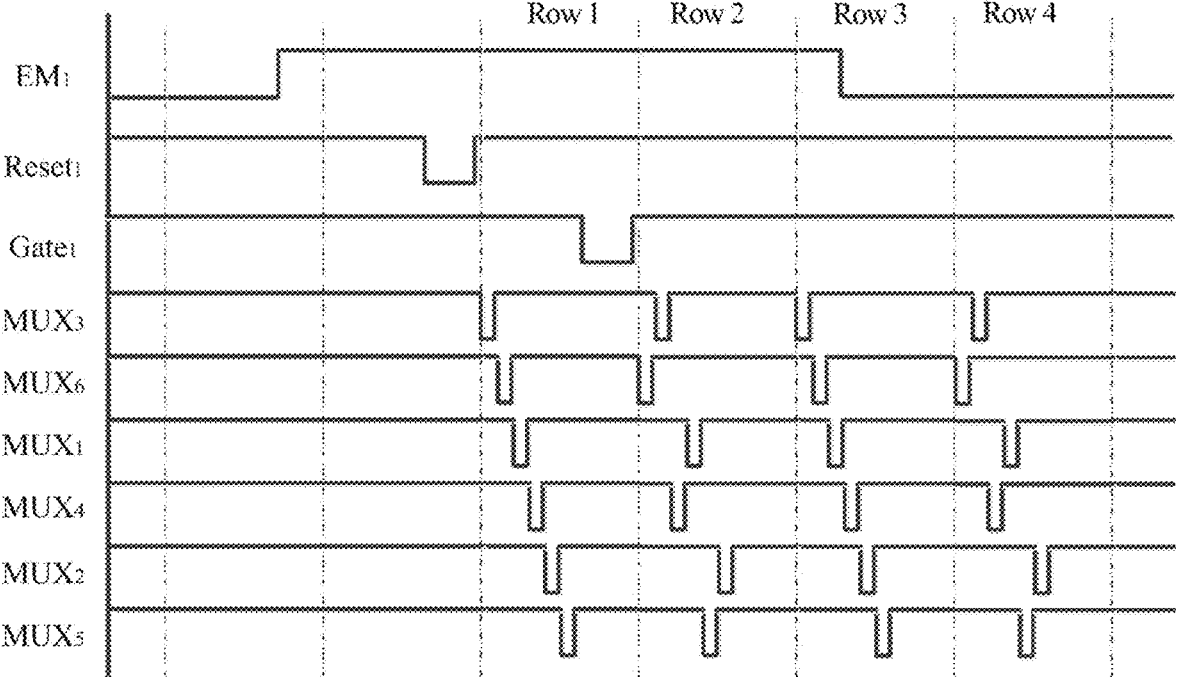
FIG. 14 is a fourth working timing diagram of the display substrate.
Figure 15:
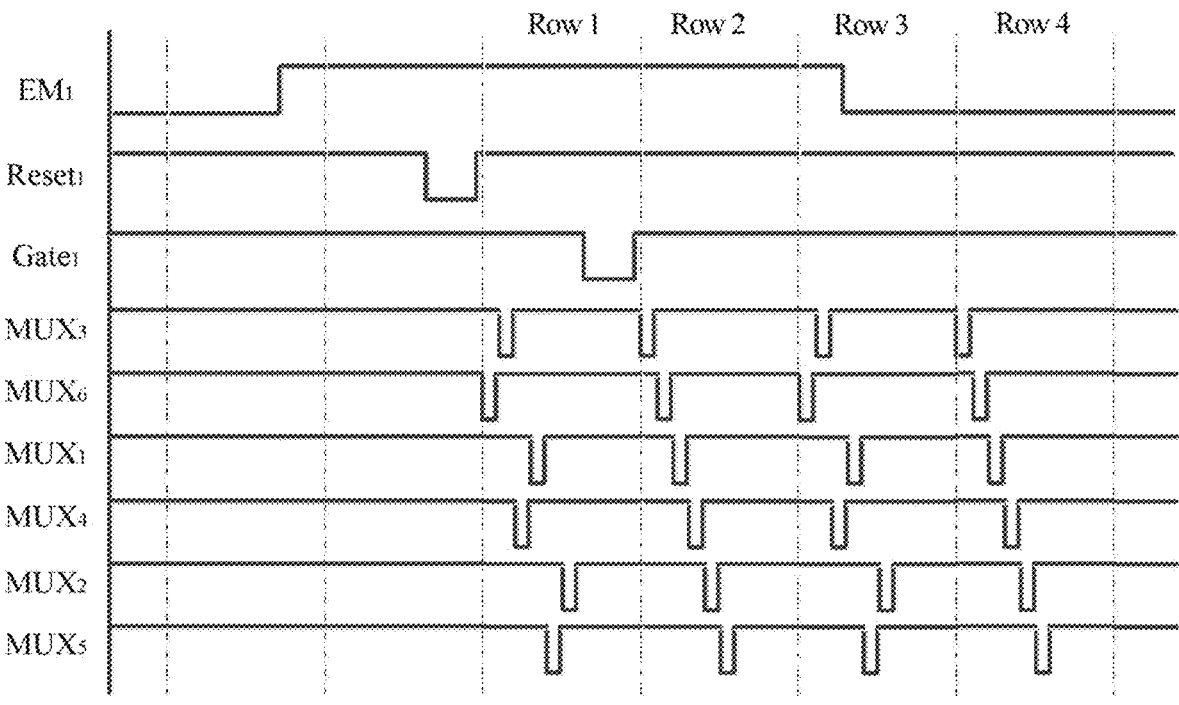
FIG. 15 is a fifth working timing diagram of the display substrate.
Figure 16:
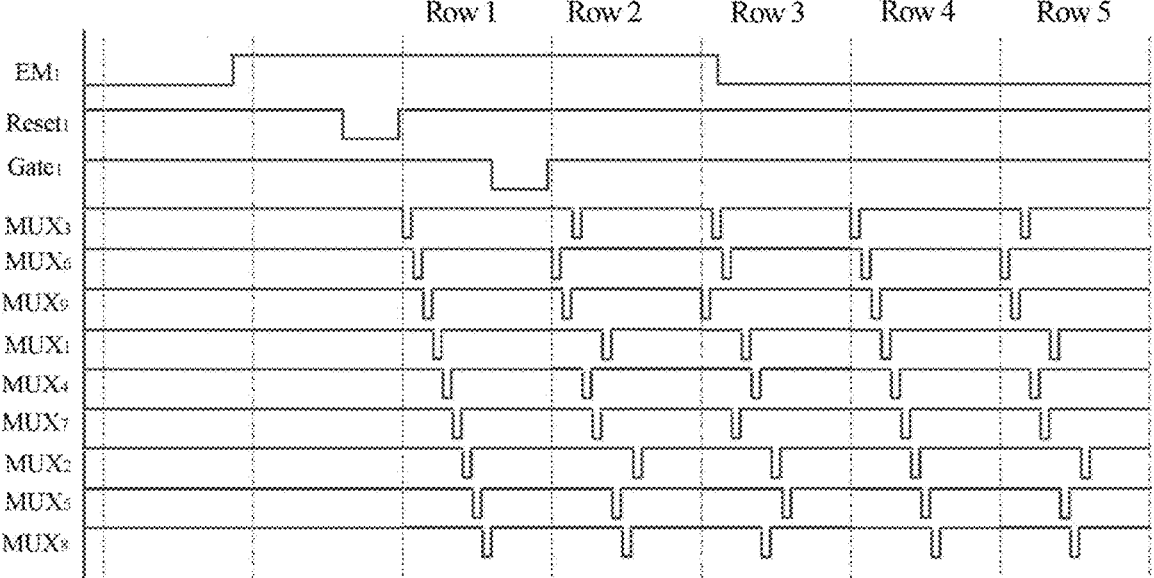
FIG. 16 is a sixth working timing diagram of the display substrate.
Figure 17:
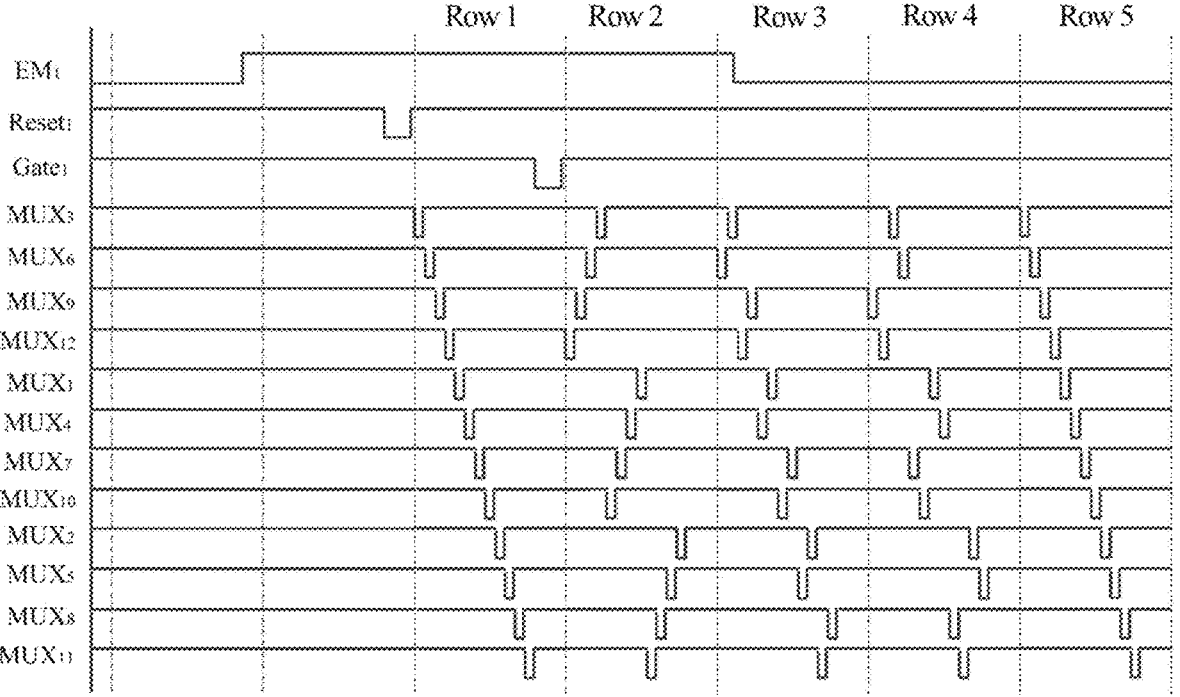
FIG. 17 is a seventh working timing diagram of the display substrate.

FIG. 11 is a first working timing diagram of a display substrate, FIG. 12 is a second working timing diagram of the display substrate, FIG. 13 is a third working timing diagram of the display substrate, FIG. 14 is a fourth working timing diagram of the display substrate, FIG. 15 is a fifth working timing diagram of the display substrate, FIG. 16 is a sixth working timing diagram of the display substrate, and FIG. 17 is a seventh working timing diagram of the display substrate. In FIGS. 11 to 17, $Gate_1$ is a signal of a scan signal line with which a first row of sub-pixels are electrically connected, $EM_1$ is a signal of a light emitting signal line with which the first row of sub-pixels are electrically connected, $Reset_1$ is a signal of a reset signal line with which the first row of sub-pixels are electrically connected, and when an i-th row indicates an i-th row of sub-pixels are displayed, FIGS. 11, 14, and 15 are illustrated by taking M=6 as an example, FIGS. 12 and 16 are illustrated by taking M=9 as an example, and FIGS. 13 and 17 are illustrated by taking M=12 as an example.

In an exemplary implementation mode, as shown in FIGS. 11 to 17, when a signal of an m-th selection signal line is an effective level signal, signals of selection signal lines other than the m-th selection signal line are all ineffective level signals, m=1, 2, . . . , M. Exemplarily, when a signal of a first selection signal line is an effective level signal the signals of all remaining selection signal lines are ineffective level signals.

In an exemplary implementation mode, as shown in FIGS. 11 to 17, content displayed by the display substrate includes a plurality of display frames, and when a k-th row of sub-pixels of at least one display frame are displayed, an end time when a signal in a plurality of selection signal lines is an effective level signal at the latest is earlier than a start time when a signal of a scan signal line electrically connected with the k-th row of sub-pixels is an effective level signal. Taking FIG. 11 as an example, the end time when the signal in the plurality of selection signal lines is the effective level signal at the latest refers to an end time when a signal of a fifth selection signal line is an effective level signal, taking FIG. 12 as an example, the end time when the signal in the plurality of selection signal lines is the effective level signal at the latest refers to an end time when a signal of an eighth selection signal line $MUX_8$ is an effective level signal, and taking FIG. 13 as an example, the end time when the signal in the plurality of selection signal lines is the effective level signal at the latest refers to an end time when a signal of an eleventh selection signal line $MUX_{11}$ is an effective level signal.

In an exemplary implementation mode, when M=6, FIG. 11 is illustrated by taking a case that in a first selection signal group, a signal line whose signal is an effective level signal at the earliest is a first selection signal line $MUX_1$, and a signal line whose signal is an effective level signal at the latest is a fourth selection signal line $MUX_4$ as an example. An effective time period t1 of the first selection signal group refers to a time period between a start time when a signal of the first selection signal line $MUX_1$ is an effective level signal and an end time when a signal of the fourth selection signal line $MUX_4$ is an effective level signal. Illustration is made by take a case that in a second selection signal group, a signal line whose signal is an effective level signal at the earliest is a second selection signal line $MUX_2$, and a signal line whose signal is an effective level signal at the latest is a fifth selection signal line $MUX_5$ as an example. An effective time period t2 of the second selection signal group refers to a time period between a start time when a signal of the second selection signal line $MUX_2$ is an effective level signal and an end time when a signal of the fifth selection signal line $MUX_5$ is an effective level signal. Illustration is made by take a case that in a third selection signal group, a signal line whose signal is an effective level signal at the earliest is a third selection signal line $MUX_3$, and a signal line whose signal is an effective level signal at the latest is a sixth selection signal line $MUX_6$ as an example. An effective time period t3 of the third selection signal group refers to a time period between a start time when a signal of the third selection signal line $MUX_3$ is an effective level signal and an end time when a signal of the sixth selection signal line $MUX_6$ is an effective level signal. Taking sub-pixels located in a first row and electrically connected with a first multiplexing sub-circuit as an example, according to a working timing provided in FIG. 11, it may be seen that a light emission sequence of the electrically connected sub-pixels is a sub-pixel in the first row and a third column, a sub-pixel in the first row and a sixth column, a sub-pixel in the first row and a first column, a sub-pixel in the first row and a fourth column, a sub-pixel in the first row and a second column, and a sub-pixel in the first row and a fifth column. The present disclosure does not make any limitation on this.

In an exemplary implementation mode, when M=9, FIG. 12 is illustrated by taking a case that in a first selection signal group, a signal line whose signal is an effective level signal at the earliest is a first selection signal line $MUX_1$, and a signal line whose signal is an effective level signal at the latest is a seventh selection signal line $MUX_7$ as an example. An effective time period t1 of the first selection signal group refers to a time period between a start time when a signal of the first selection signal line $MUX_1$ is an effective level signal and an end time when a signal of the seventh selection signal line $MUX_7$ is an effective level signal. Illustration is made by take a case that in a second selection signal group, a signal line whose signal is an effective level signal at the earliest is a second selection signal line $MUX_2$, and a signal line whose signal is an effective level signal at the latest is an eighth selection signal line $MUX_8$ as an example. An effective time period t2 of the second selection signal group refers to a time period between a start time when a signal of the second selection signal line $MUX_2$ is an effective level signal and an end time when a signal of the eighth selection signal line $MUX_8$ is an effective level signal. Illustration is made by take a case that in a third selection signal group, a signal line whose signal is an effective level signal at the earliest is a third selection signal line $MUX_3$, and a signal line whose signal is an effective level signal at the latest is a ninth selection signal line MUX, as an example. An effective time period t3 of the third selection signal group refers to a time period between a start time when a signal of the third selection signal line $MUX_3$ is an effective level signal and an end time when a signal of the ninth selection signal line MUX, is an effective level signal. Taking sub-pixels located in a first row and electrically connected with a first multiplexing sub-circuit as an example, according to a working timing provided in FIG. 12, it may be seen that a light emission sequence of the electrically connected sub-pixels is a sub-pixel in the first row and a third column, a sub-pixel in the first row and a sixth column, a sub-pixel in the first row and a ninth column, a sub-pixel in the first row and a first column, a sub-pixel in the first row and a fourth column, a sub-pixel in the first row and a seventh column, a sub-pixel in the first row and a second column, a sub-pixel in the first row and a fifth column, and a sub-pixel in the first row and an eighth column. The present disclosure does not make any limitation on this.

In an exemplary implementation mode, when M=12, FIG. 13 is illustrated by taking a case that in a first selection signal group, a signal line whose signal is an effective level signal at the earliest is a first selection signal line $MUX_1$, and a signal line whose signal is an effective level signal at the latest is a tenth selection signal line $MUX_{10}$ as an example. An effective time period t1 of the first selection signal group refers to a time period between a start time when a signal of the first selection signal line $MUX_1$ is an effective level signal and an end time when a signal of the tenth selection signal line $MUX_{10}$ is an effective level signal. Illustration is made by take a case that in a second selection signal group, a signal line whose signal is an effective level signal at the earliest is a second selection signal line $MUX_2$, and a signal line whose signal is an effective level signal at the latest is an eleventh selection signal line $MUX_{11}$ as an example. An effective time period t2 of the second selection signal group refers to a time period between a start time when a signal of the second selection signal line $MUX_2$ is an effective level signal and an end time when a signal of the eleventh selection signal line $MUX_1$ is an effective level signal. Illustration is made by take a case that in a third selection signal group, a signal line whose signal is an effective level signal at the earliest is a third selection signal line $MUX_3$, and a signal line whose signal is an effective level signal at the latest is a twelfth selection signal line $MUX_{12}$ as an example. An effective time period t3 of the third selection signal group refers to a time period between a start time when a signal of the third selection signal line $MUX_3$ is an effective level signal and an end time when a signal of the twelfth selection signal line $MUX_{12}$ is an effective level signal. Taking sub-pixels located in a first row and electrically connected with a first multiplexing sub-circuit as an example, according to a working timing provided in FIG. 13, it may be seen that a light emission sequence of the electrically connected sub-pixels is a sub-pixel in the first row and a third column, a sub-pixel in the first row and a sixth column, a sub-pixel in the first row and a ninth column, a sub-pixel in the first row and a twelfth column, a sub-pixel in the first row and a first column, a sub-pixel in the first row and a fourth column, a sub-pixel in the first row and a tenth column, a sub-pixel in the first row and a second column, a sub-pixel in the first row and a fifth column, a sub-pixel in the first row and an eighth column, and a sub-pixel in the first row and an eleventh column. The present disclosure does not make any limitation on this.

In an exemplary implementation mode, as shown in FIGS. 11 to 13, in a same display frame, when all rows in the same display frame are displayed, sequences of occurrence time when signals of a plurality of selection signal lines are effective level signals are the same, and in different display frames, when a same row is displayed, sequences of occurrence time when signals of a plurality of selection signal lines are effective level signals are the same.

In an exemplary implementation mode, taking FIG. 11 as an example, when all rows of each frame are displayed, sequences of occurrence time of a plurality of selection signal lines may be sequentially a third selection signal line $MUX_3$, a sixth selection signal line $MUX_6$, a first selection signal line $MUX_1$, a fourth selection signal line $MUX_4$, a second selection signal line $MUX_2$, and a fifth selection signal line $MUX_5$. Taking FIG. 12 as an example, when all rows of each frame are displayed, sequences of occurrence time of a plurality of selection signal lines is sequentially a third selection signal line $MUX_3$, a sixth selection signal line $MUX_6$, a ninth selection signal line $MUX_9$, a first selection signal line $MUX_1$, a fourth selection signal line $MUX_4$, a seventh selection signal line $MUX_7$, a second selection signal line $MUX_2$, a fifth selection signal line $MUX_5$, and an eighth selection signal line $MUX_8$. Taking FIG. 13 as an example, when all rows of each frame are displayed, sequences of occurrence time of a plurality of selection signal lines is sequentially a third selection signal line $MUX_3$, a sixth selection signal line $MUX_6$, a ninth selection signal line $MUX_9$, a twelfth selection signal line $MUX_{12}$, a first selection signal line $MUX_1$, a fourth selection signal line $MUX_4$, a seventh selection signal line $MUX_7$, a tenth selection signal line $MUX_{10}$, a second selection signal line $MUX_2$, a fifth selection signal line $MUX_5$, an eighth selection signal line $MUX_8$, and an eleventh selection signal line $MUX_{11}$.

In an exemplary implementation mode, in different display frames, when a same row is displayed, sequences of occurrence time when signals of a plurality of selection signal lines are effective level signals are the same, which means that when i-th rows in any two display frames are displayed, sequences of occurrence time when signals of a plurality of selection signal lines are effective level signals are all consistent.

In an exemplary implementation mode, as shown in FIGS. 11 to 13, in a same display frame, when all rows in the same display frame are displayed, sequences of occurrence time when signals of a plurality of selection signal lines are effective level signals are the same. In adjacent M/3 display frames, when different display frames are displayed, sequences of occurrence time when signals of a plurality of selection signal lines are effective level signals are different, and seat orders where occurrence time when a signal of a same selection signal line is an effective level signal is located when different display frames are displayed are different. For all display frames, when a plurality of display frames whose frame number z satisfies z%(M/3)=y are displayed, sequences of occurrence time when signals of a plurality of selection signal lines are effective level signals are the same, y=0, . . . , (M/3)−1.

Exemplarily, when M=6, in two adjacent display frames, when different display frames are displayed, sequences of occurrence time when signals of a plurality of selection signal lines are effective level signals are different, and seat orders where occurrence time when a signal of a same selection signal line is an effective level signal is located when different display frames are displayed are different. For example, when all rows in an odd display frame are displayed, a sequence of occurrence that signals of a plurality of selection signal lines are effective level signals may be sequentially a third selection signal line $MUX_3$, a sixth selection signal line $MUX_6$, a first selection signal line $MUX_1$, a fourth selection signal line $MUX_4$, a second selection signal line $MUX_2$, and a fifth selection signal line $MUX_5$. When all rows in an even display frame are displayed, a sequence of occurrence that signals of a plurality of selection signal lines are effective level signals may be sequentially the sixth selection signal line $MUX_6$, the third selection signal line $MUX_3$, the fourth selection signal line $MUX_4$, the first selection signal line $MUX_1$, the fifth selection signal line $MUX_5$, and the second selection signal line $MUX_2$. Among them, a seat order where occurrence time when a signal of the first selection signal line $MUX_1$ is an effective level signal is located is third when the odd display frame is displayed, and is fourth when the even display frame is displayed, that is, seat orders are not the same during the odd display frame and the even display frame, similarly, seat orders where occurrence time when a signal of a remaining selection signal line is an effective level signal is located are all not the same during the odd display frame and the even display frame.

Exemplarily, taking M=9 as an example, when all rows in a (3j−2)-th display frame (e.g., a first display frame, a fourth display frame, and a seventh display frame, etc.) are displayed, a sequence of occurrence that signals of a plurality of selection signal lines are effective level signals is sequentially a third selection signal line $MUX_3$, a sixth selection signal line $MUX_6$, a ninth selection signal line $MUX_9$, a first selection signal line $MUX_1$, a fourth selection signal line $MUX_4$, a seventh selection signal line $MUX_7$, a second selection signal line $MUX_2$, a fifth selection signal line $MUX_5$, and an eighth selection signal line $MUX_8$. When all rows in a (3j−1)-th display frame (e.g., a second display frame, a fifth display frame, and an eighth display frame, etc.) are displayed, a sequence of occurrence that signals of a plurality of selection signal lines are effective level signals may be sequentially a sixth selection signal line $MUX_6$, a ninth selection signal line $MUX_9$, a third selection signal line $MUX_3$, a fourth selection signal line $MUX_4$, a seventh selection signal line $MUX_7$, a first selection signal line $MUX_1$, a fifth selection signal line $MUX_5$, an eighth selection signal line $MUX_8$, and a second selection signal line $MUX_2$. When all rows in a 3j-th display frame (e.g., a third display frame, a sixth display frame, and a ninth display frame, etc.) are displayed, a sequence of occurrence that signals of a plurality of selection signal lines are effective level signals may be sequentially a ninth selection signal line $MUX_9$, a third selection signal line $MUX_3$, a sixth selection signal line $MUX_6$, a seventh selection signal line $MUX_7$, a first selection signal line $MUX_1$, a fourth selection signal line $MUX_4$, an eighth selection signal line $MUX_8$, a second selection signal line $MUX_2$, and a fifth selection signal line $MUX_5$. When M=12, and so on. Among them, taking a first display frame to a third display frame as an example, a seat order where occurrence time when a signal of the first selection signal line $MUX_1$ is an effective level signal is located is fourth when the first display frame is displayed, a seat order when the second display frame is displayed is sixth, and a seat order when the third display frame is displayed is fifth, that is, seat orders during the first display frame to the third display frame are not the same, similarly, seat orders where occurrence time when a signal of a remaining selection signal line is an effective level signal is located during three adjacent display frames are not the same.

In the present disclosure, in adjacent M/3 display frames, when different display frames are displayed, sequences of occurrence time when signals of a plurality of selection signal lines are effective level signals are different, and seat orders where occurrence time when a signal of a same selection signal line is an effective level signal is located are different when the different display frames are displayed, which may avoid occurrence of odd and even columns of bright and dark stripes.

Exemplarily, when M=6, when all display frames whose quantity of frames satisfies z%2=0, such as even display frames such as a second display frame, a fourth display frame, and a sixth display frame are displayed, sequences of occurrence time when signals of a plurality of selection signal lines are effective level signals are the same. When all display frames whose quantity of frames satisfies z%2=1, such as odd display frames such as a first display frame, a third display frame, a fifth display frame are displayed, sequences of occurrence time when signals of a plurality of selection signal lines are effective level signals are the same. Exemplarily, when M=9, when all display frames (a first display frame, a fourth display frame, a seventh display frame, etc.) whose quantity of frames satisfies z%3=1 are displayed, sequences of occurrence time when signals of a plurality of selection signal lines are effective level signals are the same, when all display frames (a second display frame, a fifth display frame, an eighth display frame, etc.) whose quantity of frames satisfies z%3=2 are displayed, sequences of occurrence time when signals of a plurality of selection signal lines are effective level signals are the same, and when all display frames (a third display frame, a sixth display frame, a ninth display frame, etc.) whose quantity of frames satisfies z%3=0 are displayed, sequences of occurrence time when signals of a plurality of selection signal lines are effective level signals are the same. Exemplarily, when M=12, when all display frames (a first display frame, a fifth display frame, a ninth display frame, etc.) whose quantity of frames satisfies z%4=1 are displayed, sequences of occurrence time when signals of a plurality of selection signal lines are effective level signals are the same, when all display frames (a second display frame, a sixth display frame, a tenth display frame, etc.) whose quantity of frames satisfies z%4=2 are displayed, sequences of occurrence time when signals of a plurality of selection signal lines are effective level signals are the same, when all display frames (a third display frame, a seventh display frame, an eleventh display frame, etc.) whose quantity of frames satisfies z%4=3 are displayed, sequences of occurrence time when signals of a plurality of selection signal lines are effective level signals are the same, and when all display frames (a fourth display frame, an eighth display frame, a twelfth display frame, etc.) whose quantity of frames satisfies z%4=0 are displayed, sequences of occurrence time when signals of a plurality of selection signal lines are effective level signals are the same.

In an exemplary implementation mode, as shown in FIGS. 14 to 17, in a same display frame, for adjacent M/3 rows, sequences of occurrence time when signals of a plurality of selection signal lines are effective level signals are different when different rows are displayed, and seat orders where occurrence time when a signal of a same selection signal line is an effective level signal is located when different rows are displayed are different. In different display frames, sequences of occurrence time when signals of a plurality of selection signal lines are effective level signals are the same when a same row is displayed. In a same display frame, when a plurality of rows whose row number x satisfies x%(M/3)=y are displayed, sequences of occurrence time when signals of a plurality of selection signal lines are effective level signals are the same, y=0, . . . , (M/3)−1.

In the present disclosure, in a same display frame, for adjacent M/3 rows, sequences of occurrence time when signals of a plurality of selection signal lines in a same selection signal group are effective level signals when different rows are displayed are different, and seat orders where occurrence time when a signal of a same selection signal line is an effective level signal is located when different rows are displayed are different, which may avoid occurrence of odd and even columns of bright and dark stripes.

Exemplarily, as shown in FIG. 14, when M=6, in a same display frame, for two adjacent rows, sequences of occurrence time when signals of a plurality of selection signal lines are effective level signals are different when different rows are displayed, and seat orders where occurrence time when a signal of a same selection signal line is an effective level signal is located when different rows are displayed are different. Exemplarily, sequences of occurrence time when signals of a plurality of selection signal lines are effective level signals are the same when all odd-numbered rows are displayed, and sequences of occurrence time when signals of a plurality of selection signal lines are effective level signals are the same when all even-numbered rows are displayed.

Exemplarily, when M=9, as shown in FIG. 16, for three adjacent rows, sequences of occurrence time when signals of a plurality of selection signal lines are effective level signals are different when different rows are displayed, and seat orders where occurrence time when a signal of a same selection signal line is an effective level signal is located are different when different rows are displayed. Exemplarily, when all rows (a first row, a fourth row, a seventh row, etc.) satisfying a (3r−2)-th row are displayed, sequences of occurrence time when signals of a plurality of selection signal lines are effective level signals are the same, when all rows (a second row, a fifth row, an eighth row, etc.) satisfying a (3r−1)-th row are displayed, sequences of occurrence time when signals of a plurality of selection signal lines are effective level signals are the same, and when all rows (a third row, a sixth row, a ninth row, etc.) satisfying a 3r-th row are displayed, sequences of occurrence time when signals of a plurality of selection signal lines are effective level signals are the same. Among them, (3r−2)%3=1, (3r−1)%3=2, (3r)%3=0.

Exemplarily, as shown in FIG. 17, when M=12, for four adjacent rows, sequences of occurrence time when signals of a plurality of selection signal lines are effective level signals are different when different rows are displayed, and seat orders where occurrence time when a signal of a same selection signal line is an effective level signal is located when different rows are displayed are different. When all rows (a first row, a fifth row, a ninth row, etc.) satisfying a (4r−3)-th row are displayed, sequences of occurrence time when signals of a plurality of selection signal lines in a same selection signal group are effective level signals are the same, when all rows (a second row, a sixth row, a tenth row, etc.) satisfying a (4r−2)-th row are displayed, sequences of occurrence time when signals of a plurality of selection signal lines in a same selection signal group are effective level signals are the same, when all rows (a third row, a seventh row, an eleventh row, etc.) satisfying a (4r−1)-th row are displayed, sequences of occurrence time when signals of a plurality of selection signal lines in a same selection signal group are effective level signals are the same, when all rows (a fourth row, an eighth row, a twelfth row, etc.) satisfying a 4r-th row are displayed, sequences of occurrence time when signals of a plurality of selection signal lines in a same selection signal group are effective level signals are the same, wherein (4r–3)%4=1, (4r–2)%4=2, (4r–1)%4=3, and (4r)%4=0.

In an exemplary implementation mode, as shown in FIG. 14, when M=6, in each display frame, for two adjacent rows, when an odd-numbered row is displayed, a sequence of occurrence time when signals of a plurality of selection signal lines are effective level signals is a third selection signal line $MUX_3$, a sixth selection signal line $MUX_6$, a first selection signal line $MUX_1$, a fourth selection signal line $MUX_4$, a second selection signal line $MUX_2$, and a fifth selection signal line $MUX_5$. When an even-numbered row is displayed, a sequence of occurrence time when signals of a plurality of selection signal lines are effective level signals is a sixth selection signal line $MUX_6$, a third selection signal line $MUX_3$, a fourth selection signal line $MUX_4$, a first selection signal line $MUX_1$, a fifth selection signal line $MUX_5$, and a second selection signal line $MUX_2$. When the odd-numbered row and the even-numbered row are displayed, seat orders where occurrence time when a signal of a selection signal line is an effective level signal is located are different. Exemplarily, a seat order where occurrence time when a signal of the first selection signal line $MUX_1$ is an effective level signal is located is third when the odd-numbered row is displayed, and is fourth when the even-numbered row is displayed, that is, seat orders are not the same during the odd-numbered row and the even-numbered row, similarly, seat orders where occurrence time when a signal of a remaining selection signal line is an effective level signal is located are all not the same during the odd-numbered row and the even-numbered row.

In an exemplary implementation mode, as shown in FIG. 15, in each display frame, when M=6, for two adjacent rows, when the odd-numbered row is displayed, a sequence of occurrence time when signals of a plurality of selection signal lines are effective level signals is a sixth selection signal line $MUX_6$, a third selection signal line $MUX_3$, a fourth selection signal line $MUX_4$, a first selection signal line $MUX_1$, a fifth selection signal line $MUX_5$, and a second selection signal line $MUX_2$. When the even-numbered row is displayed, a sequence of occurrence time when signals of a plurality of selection signal lines are effective level signals is a third selection signal line $MUX_3$, a sixth selection signal line $MUX_6$, a first selection signal line $MUX_1$, a fourth selection signal line $MUX_4$, a second selection signal line $MUX_2$, and a fifth selection signal line $MUX_5$, and a sequence of occurrence time when signals of a plurality of selection signal lines in a third selection signal group are effective level signals is. When the odd-numbered row and the even-numbered row are displayed, seat orders where occurrence time when a signal of a selection signal line is an effective level signal is located are different. Exemplarily, a seat order where occurrence time when a signal of the first selection signal line $MUX_1$ is an effective level signal is located is fourth when the odd-numbered row is displayed, and is third when the even-numbered row is displayed, that is, seat orders are not the same during the odd-numbered row and the even-numbered row, similarly, seat orders where occurrence time when a signal of a remaining selection signal line is an effective level signal is located are all not the same during the odd-numbered row and the even-numbered row.

In an exemplary implementation mode, as shown in FIG. 16, when M=9, in each display frame, when a (3r–2)-th row is displayed, a sequence of occurrence time when signals of a plurality of selection signal lines are effective level signals is a third selection signal line $MUX_3$, a sixth selection signal line $MUX_6$, a ninth selection signal line $MUX_9$, a first selection signal line $MUX_1$, a fourth selection signal line $MUX_4$, a seventh selection signal line $MUX_7$, a second selection signal line $MUX_2$, a fifth selection signal line $MUX_5$, and an eighth selection signal line $MUX_8$. When a (3r–1)-th row is displayed, a sequence of occurrence time when signals of a plurality of selection signal lines are effective level signals is the sixth selection signal line $MUX_6$, the ninth selection signal line $MUX_9$, the third selection signal line $MUX_3$, the fourth selection signal line $MUX_4$, the seventh selection signal line $MUX_7$, the first selection signal line $MUX_1$, the fifth selection signal line $MUX_5$, the eighth selection signal line $MUX_8$, and the second selection signal line $MUX_2$. When a 3r-th row is displayed, a sequence of occurrence time when signals of a plurality of selection signal lines are effective level signals is the ninth selection signal line $MUX_9$, the third selection signal line $MUX_3$, the sixth selection signal line $MUX_6$, the seventh selection signal line $MUX_7$, the first selection signal line $MUX_1$, the fourth selection signal line $MUX_4$, the eighth selection signal line $MUX_8$, the second selection signal line $MUX_2$, and the fifth selection signal line $MUX_5$, and a sequence of occurrence time when signals of a plurality of selection signal lines in a third selection signal group are effective level signals is. When three adjacent rows are displayed, seat orders where occurrence time when a signal of a selection signal line is an effective level signal is located are different. For example, taking a first row to a third row as an example, a seat order where occurrence time when a signal of the first selection signal line $MUX_1$ is an effective level signal is located is fourth when the first row is displayed, a seat order is sixth when the second row is displayed, and a seat order is fifth when the third row is displayed. That is, when the first row to the third row, seat orders are not the same, and similarly, seat orders where occurrence time when a signal of a remaining selection signal line is an effective level signal is located in three adjacent rows are all not the same.

In an exemplary implementation mode, as shown in FIG. 17, when M=12, in each display frame, when a (4r–3)-th row is displayed, a sequence of occurrence time when signals of a plurality of selection signal lines are effective level signals is a third selection signal line $MUX_3$, a sixth selection signal line $MUX_6$, a ninth selection signal line $MUX_9$, a twelfth selection signal line $MUX_{12}$, a first selection signal line $MUX_1$, a fourth selection signal line $MUX_4$, a seventh selection signal line $MUX_7$, a tenth selection signal line $MUX_{10}$, a second selection signal line $MUX_2$, a fifth selection signal line $MUX_5$, an eighth selection signal line $MUX_8$, and an eleventh selection signal line $MUX_{11}$. When a (4r–2)-th row is displayed, a sequence of occurrence time when signals of a plurality of selection signal lines are effective level signals may be a twelfth selection signal line $MUX_{12}$, a ninth selection signal line $MUX_9$, a sixth selection signal line $MUX_6$, a third selection signal line $MUX_3$, a tenth selection signal line $MUX_{10}$, a seventh selection signal line $MUX_7$, a fourth selection signal line $MUX_4$, a first selection signal line $MUX_1$, an eleventh selection signal line $MUX_{11}$, an eighth selection signal line $MUX_8$, a fifth selection signal line $MUX_5$, and a second selection signal line $MUX_2$. When a (4r–1)-th row is displayed, a sequence of occurrence time when signals of a plurality of selection signal lines are effective level signals may be a sixth selection signal line $MUX_6$, a third selection signal line $MUX_3$, a twelfth selection signal line $MUX_{12}$, a ninth selection signal line $MUX_9$, a fourth selection signal line $MUX_4$, a first selection signal line $MUX_1$, a tenth selection signal line $MUX_{10}$, a seventh selection signal line $MUX_7$, a fifth selection signal line $MUX_5$, a second selection signal line $MUX_2$, an eleventh selection signal line $MUX_{11}$, and an eighth selection signal line $MUX_8$. When a 4r-th row is displayed, a sequence of occurrence time when signals of a plurality of selection signal lines are effective level signals is the ninth selection signal line $MUX_9$, the twelfth selection signal line $MUX_{12}$, the third selection signal line $MUX_3$, the sixth selection signal line $MUX_6$, the seventh selection signal line $MUX_7$, the tenth selection signal line $MUX_{10}$, the first selection signal line $MUX_1$, the fourth selection signal line $MUX_4$, the eighth selection signal line $MUX_8$, the eleventh selection signal line $MUX_{11}$, the second selection signal line $MUX_2$, and the fifth selection signal line $MUX_5$. When four adjacent rows are displayed, seat orders where occurrence time when a signal of a selection signal line is an effective level signal is located are different. For example, taking a first row to a fourth row as an example, a seat order where occurrence time when a signal of the first selection signal line $MUX_1$ is an effective level signal is located is fifth when the first row is displayed, a seat order is eighth when the second row is displayed, a seat order is sixth when the third row is displayed, and a seat order is seventh when the fourth row is displayed. That is, when the first row to the fourth row, seat orders are not the same, and similarly, a seat order where occurrence time when a signal of a remaining selection signal line is an effective level signal is located in the four adjacent rows are all not the same.

Exemplarily, when $M=6$, when all rows whose row number satisfies $z\%2=0$, such as even-numbered rows such as a second row, a fourth row, and a sixth row are displayed, sequences of occurrence time when signals of a plurality of selection signal lines are effective level signals are the same. When all rows whose row number satisfies $z\%2=1$, such as odd-numbered rows such as a first row, a third row, and a fifth row are displayed, sequences of occurrence time when signals of a plurality of selection signal lines are effective level signals are the same. Exemplarily, when $M=9$, when all rows (a first row, a fourth row, and a seventh row, etc.) whose row number satisfies $z\%3=1$ are displayed, sequences of occurrence time when signals of a plurality of selection signal lines are effective level signals are the same, when all rows (a second row, a fifth row, and an eighth row, etc.) whose row number satisfies $z\%3=2$ are displayed, sequences of occurrence time when signals of a plurality of selection signal lines are effective level signals are the same, and when all rows (a third row, a sixth row, and a ninth row, etc.) whose row number satisfies $z\%3=0$ are displayed, sequences of occurrence time when signals of a plurality of selection signal lines are effective level signals are the same. Exemplarily, when $M=12$, when all rows (a first row, a fifth row, and a ninth row, etc.) whose row number satisfies $z\%4=1$ are displayed, sequences of occurrence time when signals of a plurality of selection signal lines are effective level signals are the same, when all rows (a second row, a sixth row, and a tenth row, etc.) whose row number satisfies $z\%4=2$ are displayed, sequences of occurrence time when signals of a plurality of selection signal lines are effective level signals are the same, when all rows (a third row, a seventh row, and an eleventh row, etc.) whose row number satisfies $z\%4=3$ are displayed, sequences of occurrence time when signals of a plurality of selection signal lines are effective level signals are the same, and when all rows (a fourth row, an eighth row, and a twelfth row, etc.) whose row number satisfies $z\%4=0$ are displayed, sequences of occurrence time when signals of a plurality of selection signal lines are effective level signals are the same.

In an exemplary implementation mode, as shown in FIGS. 14 and 15, in a same display frame, for adjacent $M/3$ rows, sequences of occurrence time when signals of a plurality of selection signal lines in a same selection signal group are effective level signals are different when different rows are displayed, and seat orders where occurrence time when a signal of a same selection signal line is an effective level signal is located when different rows are displayed are different. In adjacent $M/3$ display frames, when different display frames are displayed, sequences of occurrence time when signals of a plurality of selection signal lines in a same selection signal group are effective level signals are different, and seat orders where occurrence time when a signal of a same selection signal line is an effective level signal is located when different display frames are displayed are different. In a same display frame, when a plurality of rows whose row number x satisfies $x\%(M/3)=y$ are displayed, sequences of occurrence time when signals of a plurality of selection signal lines are effective level signals are the same. For all display frames, when a same row of a plurality of display frames whose frame number z satisfies $z\%(M/3)=y$ is displayed, sequences of occurrence time when signals of a plurality of selection signal lines are effective level signals are the same, $y=0, \ldots, M/3-1$.

For example, taking $M=6$ as an example, when an odd-numbered row in an odd-numbered frame is displayed, a sequence of occurrence that signals of a plurality of selection signal lines are effective level signals is sequentially the third selection signal line $MUX_3$, the sixth selection signal line $MUX_6$, the first selection signal line $MUX_1$, the fourth selection signal line $MUX_4$, the second selection signal line $MUX_2$, and the fifth selection signal line $MUX_5$. When an even-numbered row in the odd-numbered frame is displayed, a sequence of occurrence that signals of a plurality of selection signal lines are effective level signals is sequentially the sixth selection signal line $MUX_6$, the third selection signal line $MUX_3$, the fourth selection signal line $MUX_4$, the first selection signal line $MUX_1$, the fifth selection signal line $MUX_5$, and the second selection signal line $MUX_2$. When an even-numbered row in an even-numbered frame is displayed, a sequence of occurrence that signals of a plurality of selection signal lines are effective level signals is sequentially the third selection signal line $MUX_3$, the sixth selection signal line $MUX_6$, the first selection signal line $MUX_1$, the fourth selection signal line $MUX_4$, the second selection signal line $MUX_2$, and the fifth selection signal line $MUX_5$. When an odd-numbered row in the even-numbered frame is displayed, a sequence of occurrence that signals of a plurality of selection signal lines are effective level signals is sequentially the sixth selection signal line $MUX_6$, the third selection signal line $MUX_3$, the fourth selection signal line $MUX_4$, the first selection signal line $MUX_1$, the fifth selection signal line $MUX_5$, and the second selection signal line $MUX_2$. FIG. 14 may show a timing of the display substrate in odd frames, and FIG. 15 may show a timing of the display substrate in even frames. FIGS. 14 and 15 are limited by taking $M=6$ as an example, the present disclosure is not limited thereto.

For example, when $M=6$, when a same row of all odd-numbered frames is displayed, sequences of occurrence time when signals of a plurality of selection signal lines are effective level signals are the same, and when a same row of all even-numbered frames is displayed, sequences of occurrence time when signals of a plurality of selection signal lines are effective level signals are the same. In a same display frame, sequences of occurrence time when signals of a plurality of selection signal lines are effective level signals are the same when all odd-numbered rows are displayed, and sequences of occurrence time when signals of a plurality of selection signal lines are effective level signals are the same when all even-numbered rows are displayed.

In an exemplary implementation mode, the display substrate may include a first signal line, the first signal line at least includes a scan signal line, the first signal line and a data signal line are disposed in different layers, and an orthographic projection of the first signal line on a base substrate is at least partially overlapped with an orthographic projection of the data signal line on the base substrate, and a capacitance located between an overlapping region of the data signal line and the first signal line is a data parasitic capacitance of the data signal line.

In an exemplary implementation mode, the first signal line may further include at least one of a reset signal line and an initial signal line.

In an exemplary implementation mode, for at least one multiplexing sub-circuit, data parasitic capacitances of a plurality of data signal lines electrically connected with sub-pixels of a same color are different.

In an exemplary implementation mode, for at least one multiplexing sub-circuit, among a plurality of data signal lines electrically connected with sub-pixels of a same color, a data parasitic capacitance of an a-th data signal line is greater than a data parasitic capacitance of a b-th data signal line when a time when a signal of a selection signal line electrically connected with a multiplexing transistor connected with the a-th data signal line is an effective level signal is earlier than a time when a signal of a selection signal line connected with a multiplexing transistor connected with the b-th data signal line is an effective level signal. When the time when the signal of the selection signal line electrically connected with the multiplexing transistor connected with the a-th data signal line among the plurality of data signal lines connected with the same color sub-pixel is the effective level signal is earlier than the time when the signal of the selection signal line connected with the multiplexing transistor connected with the b-th data signal line is the effective level signal, the data parasitic capacitance of the a-th data signal line is larger than the data parasitic capacitance of the b-th data signal line, which may ensure that attenuation of a data voltage of a data signal line that is preferentially written is reduced, further, attenuation consistency of data voltages stored on a plurality of data signal lines electrically connected with a same selection signal group may be reduced, and a display effect of the display substrate may be improved.

In an exemplary implementation mode, for at least one multiplexing sub-circuit, data parasitic capacitances of at least two data signal lines electrically connected with different color sub-pixels may not be equal.

In an exemplary implementation mode, for at least one multiplexing sub-circuit, data parasitic capacitances of at least two data signal lines electrically connected with different color sub-pixels are equal.

In an exemplary implementation mode, data parasitic capacitances of a (3i−2)-th data signal line to a 3i-th data signal line may be equal.

An embodiment of the present disclosure also provides a display apparatus including a display substrate.

In an exemplary implementation mode, the display apparatus may be any product or component with a display function, such as a mobile phone, a tablet computer, a television, a display, a notebook computer, a digital photo frame, and a navigator. Other essential components of the display apparatus as understood by those of ordinary skills in the art, which will not be described in detail here and also should not be used as limitations on the present disclosure.

The display substrate is the display substrate according to any of the aforementioned embodiments, and has similar implementation principles and implementation effects, which will not be repeated here.

An embodiment of the present disclosure also provides a drive method of a display substrate, for driving the display substrate described above, the method includes: providing a signal to a plurality of selection signal lines to enable effective time periods of any two of a plurality of selection signal groups to be not overlapped.

The display substrate is the display substrate according to any of the aforementioned embodiments, and has similar implementation principles and implementation effects, which will not be repeated here.

Other aspects may be comprehended after the drawings and the detailed description are read and understood.

The drawings of the embodiments of the present disclosure only involve structures involved in the embodiments of the present disclosure, and other structures may be referred to general designs.

For the sake of clarity, a thickness and size of a layer or a micro structure are enlarged in the accompanying drawings used for describing the embodiments of the present disclosure. It may be understood that when an element such as a layer, film, region, or base substrate is described as being "on" or "under" another element, the element may be "directly" located "on" or "under" the another element, or there may be an intermediate element.

Although implementation modes disclosed in the present disclosure are disclosed above, described contents are only implementation modes used for ease of understanding of the present disclosure, but not intended to limit the present disclosure. Any of those skilled in the art of the present disclosure may make any modifications and variations in modes and details of implementation without departing from the spirit and scope of the present disclosure. However, the protection scope of the present disclosure should be subject to the scope defined in the appended claims.

The invention claimed is:

1. A display substrate, comprising: a plurality of sub-pixels arranged in an array, a multiplexing circuit, a plurality of data signal lines, a plurality of selection signal lines, and a plurality of data transmission lines, wherein:

the plurality of sub-pixels comprise: a plurality of color sub-pixels, the data signal lines are electrically connected with the plurality of sub-pixels;

the multiplexing circuit comprises: a plurality of multiplexing transistors, at least one of the plurality of multiplexing transistors is electrically connected with at least one of the plurality of data transmission lines, at least one of the plurality of selection signal lines, and at least one of the plurality of data signal lines, respectively, and the multiplexing transistor is configured to transmit a signal of the data transmission line to the data signal line under control of the selection signal line;

the plurality of selection signal lines are divided into a plurality of selection signal groups, at least one selection signal group comprises: a plurality of selection signal lines, different selection signal groups comprise different selection signal lines, and at least one of the plurality of selection signal groups is electrically connected with sub-pixels through the multiplexing transistor and the data signal line;

colors of sub-pixels electrically connected with a same selection signal group are the same, and colors of sub-pixels electrically connected with different selection signal groups are different, effective time periods of any two selection signal groups among the plurality of selection signal groups are not overlapped, wherein an effective time period of the selection signal group refers to a time period between a start time when a signal is an effective level signal at the earliest and an end time when a signal is an effective level signal at the latest in selection signal lines of the selection signal group;

the sub-pixels comprise a first color sub-pixel, a second color sub-pixel, and a third color sub-pixel, wherein a first color, a second color, and a third color are different colors and are one of red, blue, and green, respectively;

an i-th data signal line is electrically connected with an i-th column of sub-pixels; a (3×1-2)-th column of sub-pixels are first color sub-pixels, a (3×i-1)-th column of sub-pixels are second color sub-pixels, a (3×i)-th column of sub-pixels are third color sub-pixels, wherein 1≤i≤N/3, X is a multiplication operation, / is a quotient operation, N is a quantity of data signal lines, and N is a positive integer greater than or equal to 6;

an effective time period of a selection signal group electrically connected with a blue sub-pixel is earlier than effective time periods of a selection signal group electrically connected with a red sub-pixel and a selection signal group electrically connected with a green sub-pixel;

the multiplexing circuit comprises N/M multiplexing sub-circuits;

a j-th multiplexing sub-circuit is electrically connected with M data signal lines, a j-th data transmission line, and M selection signal lines respectively, Mis a quantity of selection signal lines, j=1, 2 . . . , N/M, M=3×S, M is a positive integer greater than or equal to 6, and S is a positive integer greater than or equal to 2;

the display substrate further comprises a plurality of scan signal lines, wherein the plurality of scan signal lines are electrically connected with the plurality of sub-pixels;

when a signal of an m-th selection signal line is an effective level signal, signals of selection signal lines other than the m-th selection signal line are all ineffective level signals, m=1, 2, M; and content displayed by the display substrate comprises a plurality of display frames, and when a k-th row of sub-pixels of at least one display frame are displayed, an end time when a signal in a plurality of selection signal lines is an effective level signal at the latest is earlier than a start time when a signal of a scan signal line electrically connected with the k-th row of sub-pixels is an effective level signal.

2. The display substrate according to claim 1, wherein the plurality of selection signal groups comprise: a first selection signal group, a second selection signal group, and a third selection signal group;

a sub-pixel electrically connected with the first selection signal group is a first color sub-pixel, a sub-pixel electrically connected with the second selection signal group is a second color sub-pixel, and a sub-pixel electrically connected with the third selection signal group is a third color sub-pixel.

3. The display substrate according to claim 1, wherein a quantity of multiplexing transistors is N, and N multiplexing transistors are all N-type transistors or P-type transistors;

a control electrode of an n-th multiplexing transistor is electrically connected with an l-th selection signal line, a first electrode of the n-th multiplexing transistor is electrically connected with an n-th data signal line, and a second electrode of the n-th multiplexing transistor is electrically connected with a w-th data transmission line, and % is a remainder operation, n=1, 2, . . . , N;

$$l = \begin{cases} M, & n \text{ is an integer multiple of } M \\ n \% M, & n \text{ is not an integer multiple of } M \end{cases}$$

$$w = \begin{cases} (n/M), & n \text{ is an integer multiple of } M \\ (n/M) + 1, & n \text{ is not an integer multiple of } M \end{cases}$$

the j-th multiplexing sub-circuit comprises: an (M×(j−1)+1)-th multiplexing transistor to an (M×j)-th multiplexing transistor.

4. The display substrate according to claim 1, wherein in a same display frame, sequences of occurrence time when signals of a plurality of selection signal lines are effective level signals are the same when all rows in the same display frame are displayed;

in different display frames, sequences of occurrence time when signals of a plurality of selection signal lines are effective level signals are the same when a same row is displayed.

5. The display substrate according to claim 1, wherein in a same display frame, for adjacent M/3 rows, sequences of occurrence time when signals of a plurality of selection signal lines are effective level signals are different when different rows are displayed, and seat orders where occurrence time when a signal of a same selection signal line is an effective level signal is located when different rows are displayed are different;

in different display frames, sequences of occurrence time when signals of a plurality of selection signal lines are effective level signals are the same when a same row is displayed.

6. The display substrate according to claim 5, wherein in a same display frame, when a plurality of rows whose row number x satisfies x % (M/3)=y are displayed, sequences of occurrence time when signals of a plurality of selection signal lines are effective level signals are the same, y=0, . . . , (M/3)−1.

7. The display substrate according to claim 1, wherein in a same display frame, sequences of occurrence time when signals of a plurality of selection signal lines are effective level signals are the same when all rows in the same display frame are displayed;

in adjacent M/3 display frames, when different display frames are displayed, sequences of occurrence time when signals of a plurality of selection signal lines are effective level signals are different, and seat orders where occurrence time when a signal of a same selection signal line is an effective level signal is located when different display frames are displayed are different.

8. The display substrate according to claim 7, wherein for all display frames, when a plurality of display frames whose frame number z satisfies z % (M/3)=y are displayed, sequences of occurrence time when signals of a plurality of selection signal lines are effective level signals are the same, $y=0, \ldots, (M/3)-1$.

9. The display substrate according to claim 1, wherein in a same display frame, for adjacent M/3 rows, sequences of occurrence time when signals of a plurality of selection signal lines are effective level signals are different when different rows are displayed, and seat orders where occurrence time when a signal of a same selection signal line is an effective level signal is located when different rows are displayed are different;

in adjacent M/3 display frames, when a same row of different display frames is displayed, sequences of occurrence time when signals of a plurality of selection signal lines are effective level signals are different, and seat orders where occurrence time when a signal of a same selection signal line is an effective level signal is located when the same row of different display frames is displayed are different.

10. The display substrate according to claim 9, wherein in a same display frame, when a plurality of rows whose row number x satisfies x % (M/3)=y are displayed, sequences of occurrence time when signals of a plurality of selection signal lines are effective level signals are the same;

for all display frames, when a same row of a plurality of display frames whose frame number z satisfies z % (M/3)=y is displayed, sequences of occurrence time when signals of a plurality of selection signal lines are effective level signals are the same, $y=0, \ldots, M/3-1$.

11. The display substrate according to claim 1, comprising: a first signal line, wherein the first signal line at least comprises a scan signal line, the first signal line and a data signal line are disposed in different layers, and an orthographic projection of the first signal line on a base substrate is at least partially overlapped with an orthographic projection of the data signal line on the base substrate, and a capacitance located between an overlapping region of the data signal line and the first signal line is a data parasitic capacitance of the data signal line;

for at least one multiplexing sub-circuit, data parasitic capacitances of a plurality of data signal lines electrically connected with sub-pixels of a same color are different.

12. The display substrate according to claim 11, wherein for at least one multiplexing sub-circuit, among a plurality of data signal lines electrically connected with sub-pixels of a same color, a data parasitic capacitance of an a-th data signal line is greater than a data parasitic capacitance of a b-th data signal line when a time when a signal of a selection signal line electrically connected with a multiplexing transistor connected with the a-th data signal line is an effective level signal is earlier than a time when a signal of a selection signal line connected with a multiplexing transistor connected with the b-th data signal line is an effective level signal.

13. The display substrate according to claim 12, wherein for at least one multiplexing sub-circuit, data parasitic capacitances of at least two data signal lines electrically connected with different color sub-pixels are equal.

14. The display substrate according to claim 13, wherein data parasitic capacitances of a (3i-2)-th data signal line to a 3i-th data signal line are equal.

15. A display apparatus, comprising: the display substrate according to claim 1.

16. A drive method of the display substrate, for driving the display substrate according to claim 1, wherein the method comprises:

providing a signal to a plurality of selection signal lines to enable effective time periods of any two of a plurality of selection signal groups to be not overlapped.

* * * * *